(12) United States Patent
Kouno

(10) Patent No.: US 8,817,515 B2
(45) Date of Patent: Aug. 26, 2014

(54) NONVOLATILE SEMICONDUCTOR MEMORY DEVICE

(71) Applicant: Panasonic Corporation, Osaka (JP)

(72) Inventor: Kazuyuki Kouno, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/957,260

(22) Filed: Aug. 1, 2013

(65) Prior Publication Data

US 2013/0314969 A1 Nov. 28, 2013

Related U.S. Application Data

(63) Continuation of application No. PCT/JP2012/000187, filed on Jan. 13, 2012.

(30) Foreign Application Priority Data

Feb. 1, 2011 (JP) .................................. 2011-019790

(51) Int. Cl.
| | |
|---|---|
| *G11C 5/06* | (2006.01) |
| *G11C 5/08* | (2006.01) |
| *G11C 7/10* | (2006.01) |
| *G11C 13/00* | (2006.01) |
| *G11C 11/22* | (2006.01) |

(52) U.S. Cl.
CPC .............. *G11C 5/063* (2013.01); *G11C 7/1096* (2013.01); *G11C 2013/0088* (2013.01); *G11C 13/0069* (2013.01); *G11C 2013/0073* (2013.01); *G11C 2213/79* (2013.01); *G11C 13/0002* (2013.01); *G11C 5/08* (2013.01); *G11C 11/2275* (2013.01)
USPC ............. 365/65; 365/148; 365/158; 365/163; 365/189.17

(58) Field of Classification Search
CPC ...... G11C 11/22; G11C 11/16; G11C 7/1096; G11C 11/2275; G11C 13/0002; G11C 13/0069; G11C 2013/0002; G11C 2013/0069; G11C 5/08; G11C 5/063; G11C 2213/79
USPC .............. 365/65, 145, 148, 158, 163, 189.14, 365/189.15, 189.16, 189.17
See application file for complete search history.

(56) References Cited

U.S. PATENT DOCUMENTS

| | | | |
|---|---|---|---|
| 7,236,393 B2 * | 6/2007 | Cho et al. ........................ | 365/163 |
| 7,755,932 B2 * | 7/2010 | Ito et al. ......................... | 365/158 |

(Continued)

FOREIGN PATENT DOCUMENTS

| | | |
|---|---|---|
| JP | 2005-216387 A | 8/2005 |
| JP | 2008-065953 A | 3/2008 |

OTHER PUBLICATIONS

International Search Report issued in International Patent Application No. PCT/JP2012/000187 mailed on Feb. 28, 2012.

*Primary Examiner* — Tan T. Nguyen
(74) *Attorney, Agent, or Firm* — McDermott Will & Emery LLP

(57) ABSTRACT

Each of m word lines is connected to n memory cells in a corresponding one of rows of m×n memory cells. Each of n bit lines is connected to m memory cells in a corresponding one of columns of m×n memory cells, and each of n source lines is connected to m memory cells in a corresponding one of columns of m×n memory cells. N first switching elements switch connection states between a reference node and the n bit lines, and n second switching elements switch connection states between the reference node and the n source lines. N third switching elements switch connection states between the write driver and the n bit lines, and n fourth switching elements switch connection states between the write driver and the n source lines.

17 Claims, 15 Drawing Sheets

(56) References Cited

U.S. PATENT DOCUMENTS

| | | | |
|---|---|---|---|
| 8,625,338 B2 * | 1/2014 | Zhu et al. | 365/171 |
| 2004/0184331 A1 | 9/2004 | Hanzawa et al. | |
| 2004/0264244 A1 | 12/2004 | Morimoto | |
| 2005/0122768 A1 | 6/2005 | Fukumoto | |
| 2005/0174854 A1 | 8/2005 | Tsushima et al. | |
| 2008/0049487 A1 | 2/2008 | Yoshimura et al. | |

* cited by examiner

| OPERATION MODE | WL | BL | SL |
|---|---|---|---|
| RESET (INCREASE RESISTANCE) | VH | VSS | Vwrite |
| SET (REDUCE RESISTANCE) | VH | Vwrite | VSS |
| READ | VH | Vread | VSS |

NONVOLATILE SEMICONDUCTOR MEMORY DEVICE

CROSS-REFERENCE TO RELATED APPLICATIONS

This is a continuation of International Application No. PCT/JP2012/000187 filed on Jan. 13, 2012, which claims priority to Japanese Patent Application No. 2011-019790 filed on Feb. 1, 2011. The entire disclosures of these applications are incorporated by reference herein.

BACKGROUND

The technology disclosed in this specification relates to nonvolatile semiconductor memory devices.

In recent years, as demands for electronic devices (in particular, mobile phones, portable music players, digital cameras, etc.) have increased, demands for nonvolatile semiconductor memory devices have been increasing. Thus, emphasis has been placed on the development of techniques for increasing the capacity, reducing the size, increasing the read and write speeds, and reducing power consumed by a write operation and a read operation of a nonvolatile semiconductor memory device.

At present, flash memories are main products as nonvolatile semiconductor memory devices, but novel nonvolatile semiconductor memory devices are also being actively developed. Examples of such novel nonvolatile semiconductor memory devices include resistive random access memories (ReRAMs) using variable resistance elements as memory elements. For example, in the flash memory, the rewrite time is in the order of microseconds (or milliseconds), and a rewrite operation is performed by using a voltage higher than or equal to 10 V, whereas in the ReRAM, the rewrite time is in the order of nanoseconds, and a rewrite operation can be performed by using a voltage of about 1.8 V. Thus, the speed of the rewrite operation can be higher, and the power consumed by the rewrite operation can be lower in the ReRAM than in the flash memory. Such a ReRAM is described in, for example, Japanese Patent Publication No. 2008-65953 (Patent Document 1) and Japanese Patent Publication No. 2005-216387 (Patent Document 2).

Patent Documents 1 and 2 describe a nonvolatile semiconductor memory device including a plurality of memory cells disposed in rows and columns, a plurality of word lines and a plurality of source lines disposed parallel to each other in the row direction, and a plurality of bit lines disposed parallel to each other in the column direction. When the connection relationship between the lines is described, focusing on one of the word lines, each source line is commonly connected to the memory cells commonly connected to the word line, and each bit line is separately connected to a different one of the memory cells commonly connected the word line. In this nonvolatile semiconductor memory device, one of the word lines is activated to select a target memory cell of a rewrite operation, and the voltage of the bit line and the voltage of the source line which are connected to the target memory cell of the rewrite operation are controlled to cause a voltage difference between the bit line and the source line, thereby changing the resistance state of a variable resistance element included in the target memory cell of the rewrite operation. In this way, a data value stored in the target memory cell of the rewrite operation is changed.

As the novel nonvolatile semiconductor memory device described above, in addition to the ReRAMs, ferroelectric random access memories (FeRAMs), magnetoresistive random access memories (MRAMs), phase change random access memories (PRAMs), and the like are being developed.

SUMMARY

However, in the nonvolatile semiconductor memory device described in Patent Documents 1 and 2, each source line is commonly connected to the memory cells commonly connected to the word line. Therefore, when one of the word lines is activated, the memory cells commonly connected to the word line are simultaneously selected, and a voltage (a voltage required for the rewrite operation) is supplied to the memory cells via a corresponding one of the source lines. Thus, the parasitic resistance of the source line and the voltage drop in a source driver driving the source line reduce the voltage of the source line. As a result, rewrite properties (e.g., the accuracy of the rewrite operation) are deteriorated. The rewrite properties are more significantly deteriorated when the number of memory cells to which a voltage has to be supplied by one source line is larger.

Moreover, when the memory cells commonly connected to the word line include both a target memory cell of the rewrite operation, and a memory cell which is not a target memory cell of the rewrite operation, a precharge operation may be required so that no voltage difference is caused between the source line and the bit line in the memory cell which is not a target memory cell of the rewrite operation. Therefore, it is difficult to reduce the rewrite time and the power consumption.

Moreover, in the nonvolatile semiconductor memory device described in Patent Documents 1 and 2, each bit line is separately connected to a different one of the memory cells commonly connected to the source line. Therefore, a driver for driving the source line and a driver for driving the bit line have to be separately provided. Therefore, it is difficult to reduce the circuit area of the nonvolatile semiconductor memory device.

Thus, it is an objective of the technology disclosed in this specification to provide a nonvolatile semiconductor memory device in which degradation in the rewrite properties, the rewrite time, the power consumption, and the circuit scale can be reduced.

According to an aspect of the invention, a nonvolatile semiconductor memory device includes: m×n memory cells disposed in m rows and n columns, where m and n are integers greater than or equal to 2; m word lines each connected to n memory cells in a corresponding one of the rows of the m×n memory cells; n bit lines and n source lines each connected to m memory cells in a corresponding one of the columns of the m×n memory cells; a word line drive circuit configured to selectively activate the m word lines; a write driver configured to supply a rewrite voltage; a first selection circuit including n first switching elements each configured to switch a connection state between a reference node to which a reference voltage is applied and a corresponding one of the n bit lines, and n second switching elements each configured to switch a connection state between the reference node and a corresponding one of the n source lines; and a second selection circuit including n third switching elements each configured to switch a connection state between the write driver and a corresponding one of the n bit lines; and n fourth switching elements each configured to switch a connection state between the write driver and a corresponding one of the n source lines.

In the nonvolatile semiconductor memory device, when the connection relationship between the lines is described, focusing on one of the word lines, each of the bit lines is separately connected to a different one of the memory cells commonly connected to the word line, and each of the source lines is separately connected to a different one of the memory cells commonly connected to the word line. Thus, when one of the word lines is activated, only one of the memory cells connected to each source line is selected, and a voltage is transferred to the memory cell via the source line (one source line). In this case, the number of memory cells to which a voltage has to be transferred by one source line is smaller than in the case where each source line is commonly connected to the memory cells commonly connected to the word line. Thus, it is possible to inhibit a reduction in the voltage of a source line due to the voltage drop across the parasitic resistance of the source line, so that the degradation of rewrite properties can be reduced. Moreover, even when the plurality of memory cells commonly connected to each word line include both a target memory cell of the rewrite operation and a memory cell which is not a target memory cell of the rewrite operation, it is not necessary to perform a precharge operation, so that the rewrite time and power consumption can be reduced. Furthermore, it is not necessary to provide a source driver for each source line, so that the circuit scale of the nonvolatile semiconductor memory device can be reduced.

In a rewrite operation of changing a data value stored in any one of the m×n memory cells from a first value to a second value, one of the n first switching elements which corresponds to the bit line connected to the target memory cell is preferably in an on state, one of the n second switching elements which corresponds to the source line connected to the target memory cell is preferably in an off state, one of the n third switching elements which corresponds to the bit line connected to the target memory cell is preferably in the off state, and one of the n fourth switching elements which corresponds to the source line connected to the target memory cell is preferably in the on state.

As described above, when the first and fourth switching elements are in the on state, a reference voltage and a rewrite voltage are respectively applied to the bit line and the source line connected to the target memory cell of the rewrite operation. In this way, the data value stored in the target memory cell of the rewrite operation can be changed. Moreover, when the second and third switching elements are in the off state, it is possible to prevent short circuiting between the write driver and the reference node.

Moreover, (n−1) of the n first switching elements which do not correspond to the bit line connected to the target memory cell may be in the on state, (n−1) of the n second switching elements which do not correspond to the source line connected to the target memory cell may be in the on state, (n−1) of the n third switching elements which do not correspond to the bit line connected to the target memory cell may be in the off state, and (n−1) of the n fourth switching elements which do not correspond to the source line connected to the target memory cell may be in the off state.

When the switching elements are controlled to be in the above-described state, a reference voltage is applied to (n−1) of the bit lines and (n−1) of the source lines which are not connected to the target memory cell of the rewrite operation. Thus, data values stored in memory cells which are not target memory cells of the rewrite operation can be prevented from being changed.

In a rewrite operation of changing a data value stored in any one of the m×n memory cells from a second value to a first value, one of the n first switching elements which corresponds to the bit line connected to the target memory cell is preferably in an off state, one of the n second switching elements which corresponds to the source line connected to the target memory cell is preferably in an on state, one of the n third switching elements which corresponds to the bit line connected to the target memory cell is preferably in the on state, and one of the n fourth switching elements which corresponds to the source line connected to the target memory cell is preferably in the off state.

As described above, when the second and third switching elements are in the on state, a rewrite voltage and a reference voltage are respectively applied to the bit line and the source line connected to the target memory cell of the rewrite operation. In this way, the data value stored in the target memory cell of the rewrite operation can be changed. Moreover, when the first and fourth switching elements are in the off state, it is possible to prevent short circuiting between the write driver and the reference node.

After completion of the rewrite operation, the n first switching elements may be in the on state, the n second switching elements may be in the on state, the n third switching elements may be in the off state, and the n fourth switching elements may be in the off state.

When the switching elements are controlled to be in the above-described state, a reference voltage is applied to the n bit lines and the n source lines. In this way, voltage fluctuations of the bit line and the source line due to disturbing noise can be reduced, so that it is possible to reduce erroneous changes of the data values stored in the memory cells.

The nonvolatile semiconductor memory device may further include: a sense amplifier, wherein one end of each of the n third switching elements is connected to the write driver and the sense amplifier, and the other end of each of the n third switching elements is connected to a corresponding one of the n bit lines, one end of each of the n fourth switching elements is connected to the write driver and the sense amplifier, and the other end of each of the n fourth switching elements is connected to a corresponding one of the n source lines, the write driver supplies the rewrite voltage in a rewrite operation of rewriting a data value stored in any one of the m×n memory cells, and the sense amplifier supplies a read voltage in a read operation of reading a data value stored in any one of the m×n memory cells.

In the read operation of reading a data value stored in any one of the m×n memory cells, one of the n first switching elements which corresponds to the bit line connected to the target memory cell is preferably in an off state, one of the n second switching elements which corresponds to the source line connected to the target memory cell is preferably in an on state, one of the n third switching elements which corresponds to the bit line connected to the target memory cell is preferably in the on state, and one of the n fourth switching elements which corresponds to the source line connected to the target memory cell is preferably in the off state.

As described above, when the second and third switching elements are in the on state, a read voltage and a reference voltage are respectively applied to the bit line and the source line connected to the target memory cell of the read operation. Moreover, when the first and fourth switching elements are in the off state, it is possible to prevent short circuiting between the sense amplifier and the reference node.

Each of the m×n memory cells may include a selection transistor having a gate connected to the word line corresponding to the memory cell, and a memory element connected to the selection transistor in series between the bit line and the source line corresponding to the memory cell, the memory element may be configured to change a data value stored in the memory element when a pulse voltage higher than a predetermined threshold voltage is applied to both ends of the memory element, and a voltage difference between the rewrite voltage and the reference voltage may be larger than the threshold voltage.

Each of the m×n memory cells may include a selection transistor having a gate connected to the word line corresponding to the memory cell, and a variable resistance element connected to the selection transistor in series between the bit line and the source line corresponding to the memory cell. Alternatively, each of the m×n memory cells may include a ferroelectric element, a magnetic variable resistance element, or a phase-change element instead of the variable resistance element.

According to another aspect of the present invention, a nonvolatile semiconductor memory device includes a plurality of memory blocks; m word lines, where m is an integer greater than or equal to 2; a word line drive circuit; and first and second select control circuits, wherein each of the memory blocks includes m×n memory cells disposed in m rows and n columns, where m and n are integers greater than or equal to 2; n bit lines and n source lines each connected to m memory cells in a corresponding one of the columns of the m×n memory cells; a write driver configured to supply a rewrite voltage; a first selection circuit including n first switching elements each configured to switch a connection state between a reference node to which a reference voltage is applied and a corresponding one of the n bit lines, and n second switching elements each configured to switch a connection state between the reference node and a corresponding one of the n source lines; and a second selection circuit including n third switching elements each configured to switch a connection state between the write driver and a corresponding one of the n bit lines; and n fourth switching elements each configured to switch a connection state between the write driver and a corresponding one of the n source lines, each of the m word lines correspond to a different one of the m rows of the m×n memory cells in the memory blocks, and is connected to a different one of n memory cells included in the row corresponding to the word line, the word line drive circuit selectively activates the m word lines, the first select control circuit controls the n first switching elements and the n second switching elements included in the first selection circuit of each of the memory blocks, and the second select control circuit controls the n third switching elements and the n fourth switching elements included in the second selection circuit of each of the memory blocks.

In the nonvolatile semiconductor memory device, each of the bit lines is separately connected to a different one of the memory cells commonly connected to the word line, and each of the source lines is separately connected to a different one of the memory cells commonly connected the word line. Thus, when one of the word lines is activated, only one of the memory cells connected to each source line is selected, and a voltage is transferred to the memory cell via the source line (one source line). In this case, the number of memory cells to which a voltage has to be transferred by one source line is smaller than in the case where each source line is commonly connected to the memory cells commonly connected to the word line. Thus, it is possible to inhibit a reduction in the voltage of a source line due to the voltage drop across the parasitic resistance of the source line, so that the degradation of rewrite properties can be reduced. Alternatively, when the rewrite operation is simultaneously performed on the plurality of memory cells commonly connected to one of the word lines, a voltage is transferred to each memory cell by the source line corresponding to the memory cell. Thus, variations in the rewrite property between the target memory cells of the rewrite operation can be reduced compared to the case where one source line is commonly connected to a plurality of memory cells commonly connected to the word line. Moreover, even when the plurality of memory cells commonly connected to each word line include both a target memory cell of the rewrite operation and a memory cell which is not a target memory cell of the rewrite operation, it is not necessary to perform a precharge operation, so that the rewrite time and power consumption can be reduced. Furthermore, it is not necessary to provide a source driver for each source line, so that the circuit scale of the nonvolatile semiconductor memory device can be reduced.

DETAILED DESCRIPTION

Figure 1:
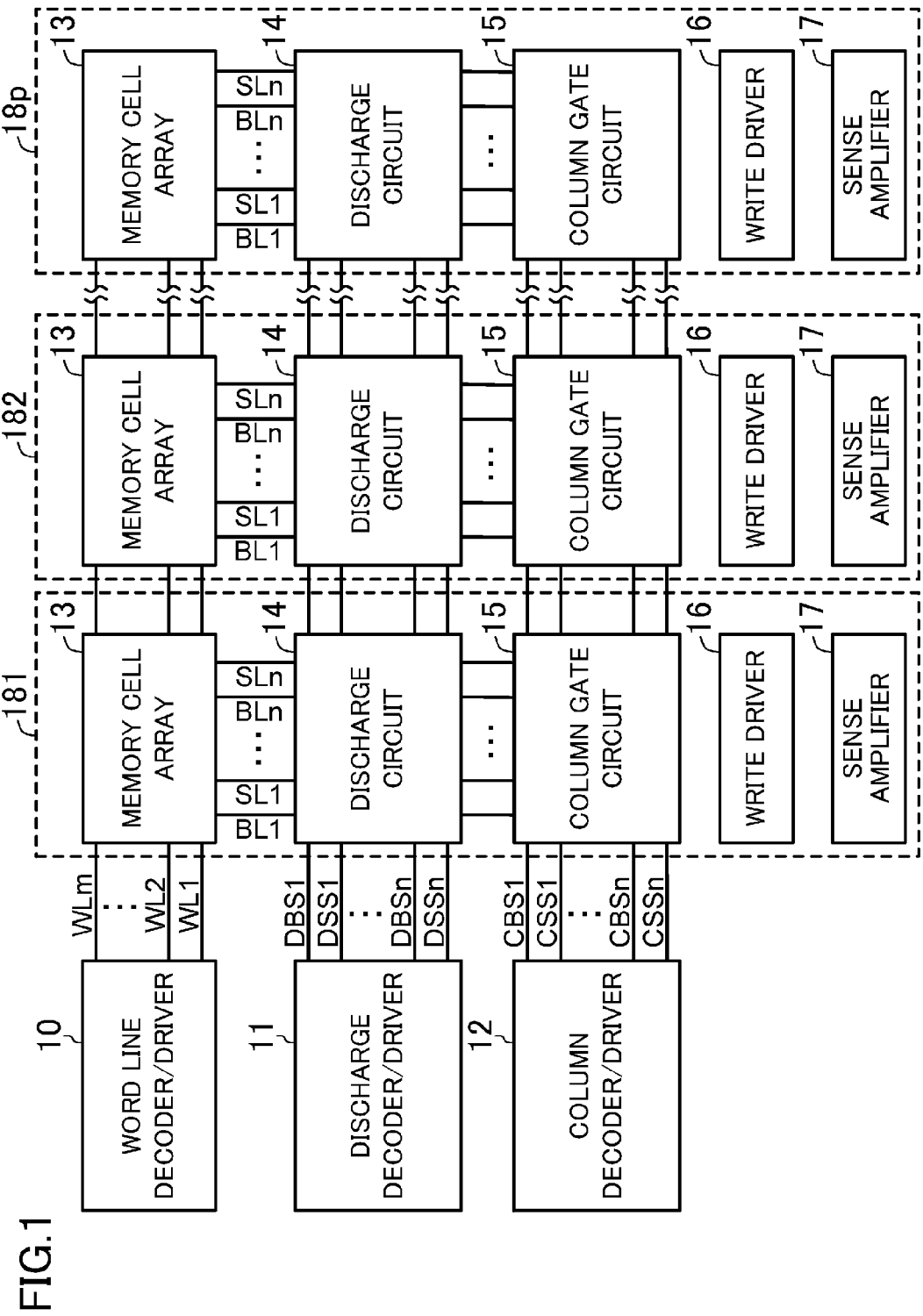
FIG. 1 is a view illustrating an example configuration of a nonvolatile semiconductor memory device.

Embodiments will be described in detail below with reference to the drawings. In the drawings, like reference characters have been used to designate identical or equivalent elements, and explanation thereof is not repeated.

(Nonvolatile Semiconductor Memory Device)

FIG. 1 shows an example configuration of a nonvolatile semiconductor memory device. The nonvolatile semiconductor memory device includes m word lines WL1-WLm (where m is an integer greater than or equal to 2), a word line decoder/driver 10, a discharge decoder/driver 11, a column decoder/driver 12, and p memory blocks 181-18$p$ (where p is an integer greater than or equal to 1). Each of the memory blocks 181-18$p$ includes a memory cell array 13, n bit lines BL1-BLn (where n is an integer greater than or equal to 2), n source lines SL1-SLn, a discharge circuit 14, a column gate circuit 15, a write driver 16, and a sense amplifier 17. That is, the memory blocks 181-18$p$ have the same configuration. Note that in the description here, the nonvolatile semiconductor memory device is a resistive random access memory (ReRAM).

Figure 2:
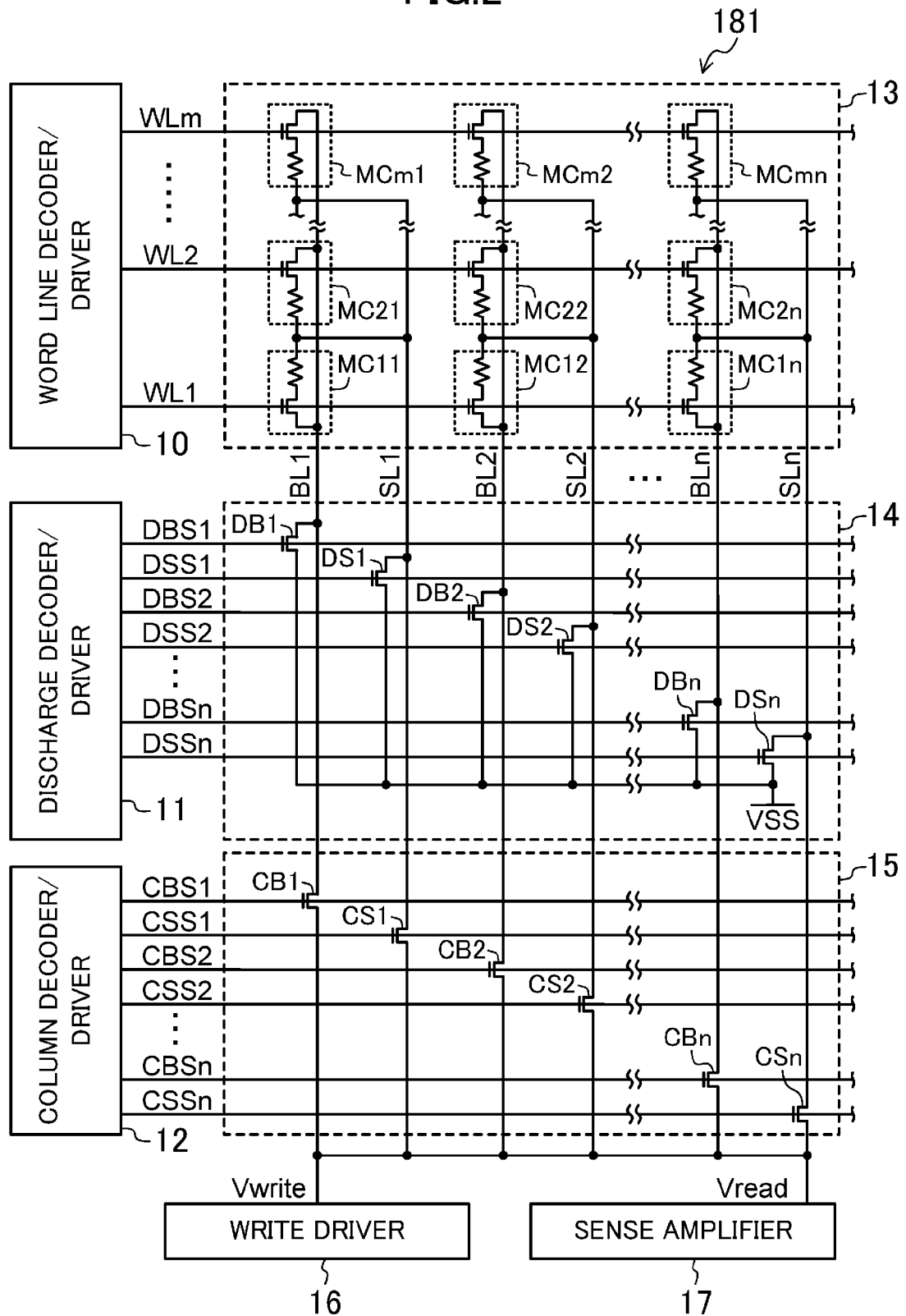
FIG. 2 is a view illustrating the example configuration of the nonvolatile semiconductor memory device in detail.

Next, with reference to FIG. 2, the example configuration of the nonvolatile semiconductor memory device will be described in detail. Since the memory blocks 181-18$p$ have the same configuration, the configuration of the memory block 181 will be described here as an example.

[Decoder/Driver]

In response to an input address (not shown), the word line decoder/driver 10 (word line drive circuit) selectively activates the m word lines. In response to the input address, the discharge decoder/driver 11 (first select control circuit) activates/deactivates n discharge control signals DBS1-DBSn and n discharge control signals DSS1-DSSn, thereby controlling the discharge circuits 14 included in the memory blocks 181-18$p$. In response to the input address, the column decoder/driver 12 (second select control circuit) activates/deactivates n column control signals CBS1-CBSn and n column control signals CSS1-CSSn, thereby controlling the column gate circuits 15 included in the memory blocks 181-18$p$.

[Memory Cell Array]

The memory cell array 13 includes m×n memory cells MC11-MCmn disposed in m rows and n columns. In each of the memory blocks 181-18$p$, the m word lines WL1-WLm correspond to the m rows (m memory cell rows) of the memory cells MC11-MCmn. Moreover, each of the word lines WL1-WLm is connected to n memory cells included in a corresponding one of the rows. For example, the first-row word line WL1 is connected to n memory cells MC11-MC1n included in the first row in each of the memory blocks 181-18$p$ (i.e., the first-row word line WL1 is connected to n×p memory cells). The n bit lines BL1-BLn correspond to the n columns (n memory cell columns) of the memory cells MC11-MCmn. Moreover, each of the bit lines BL1-BLn is connected to m memory cells included in a corresponding one of the columns. For example, the bit line BL1 is connected to m memory cells MC11-MCm1 included in the first column.

Thus, the word lines WL1-WLm are disposed parallel to each other in the row direction of the memory cells MC11-MCrm, and the bit lines BL1-BLn and the source lines SL1-SLn are disposed parallel to each other in the column direction of the memory cells MC11-MCmn. That is, the bit lines BL1-BLn and the source lines SL1-SLn are disposed to be orthogonal to the word lines WL1-WLm. Moreover, the n bit lines BL1-BLn are respectively connected to the n memory cells MC11-MC1n commonly connected to the word line WL1, the n source lines SL1-SLn are respectively connected to the n memory cells MC11-MC1n commonly connected to the word line WL1, and the bit line BL1 is commonly connected to the m memory cells MC11-MCm1 commonly connected to the source line SL1. The same applies to the other word lines WL2-WLm, source lines SL2-SLn, and bit lines BL2-BLn.

[Discharge Circuit]

The discharge circuit 14 (first selection circuit) includes n discharge transistors DB1-DBn (first switching elements) and n discharge transistors DS1-DSn (second switching elements). In response to the n discharge control signals DBS1-DBSn from the discharge decoder/driver 11, the n discharge transistors DB1-DBn switch connection states between a reference node to which a reference voltage VSS is applied (e.g., a ground node to which a ground voltage is applied) and the n bit lines BL1-BLn, respectively. In response to the discharge control signals DSS1-DSSn from the discharge decoder/driver 11, the n discharge transistors DS1-DSn switch connection states between the reference node and the n source lines SL1-SLn, respectively. When the discharge control signals DBS1-DBSn and DSS1-DSSn are activated (e.g., a high-level voltage is applied), the discharge transistors DB1-DBn and DS1-DSn are in an on state, and when the discharge control signals DBS1-DBSn and DSS1-DSSn are deactivated (e.g., a low-level voltage is applied), the discharge transistors DB1-DBn and DS1-DSn are in an off state.

[Column Gate Circuit]

The column gate circuit 15 includes n column transistors CB1-CBn (third switching elements) and n column transistors CS1-CSn (fourth switching elements). In response to the n column control signals CBS1-CBSn from the column decoder/driver 12, the n column transistors CB1-CBn switch connection states between the write driver 16 and the n bit lines BL1-BLn. In response to the n column control signals CSS1-CSSn from the column decoder/driver 12, the n column transistors CS1-CSn switch connection states between the write driver 16 and the n source lines SL1-SLn. When the column control signals CBS1-CBSn and CSS1-CSSn are activated, the column transistors CB1-CBn and CS1-CSn are in the on state, and when the column control signals CBS1-CBSn and CSS1-CSSn are deactivated, the column transistors CB1-CBn and CS1-CSn are in the off state.

[Write Driver]

When the rewrite operation of rewriting data values stored in the memory cells MC11-MCmn is performed, the write driver 16 supplies a rewrite voltage Vwrite (e.g., a positive voltage). For example, when a data value stored in a target memory cell of the rewrite operation and a write data value (a data value to be written to the target memory cell) are different from each other (when the rewrite operation is performed), the write driver 16 supplies a rewrite voltage Vwrite, and when the write data value is the same as the data value stored in the target memory cell of the rewrite operation (when the rewrite operation is not performed), the write drive 16 outputs the reference voltage VSS.

[Sense Amplifier]

When the read operation of reading data values stored in the memory cells MC11-MCmn is performed, the sense amplifier 17 supplies a read voltage Vread. Moreover, the sense amplifier 17 determines a data value stored in a target memory cell of the read operation based on a current value of a memory cell current generated by the supplied read voltage Vread.

[Example Configuration of Memory Cell]

Figure 3:
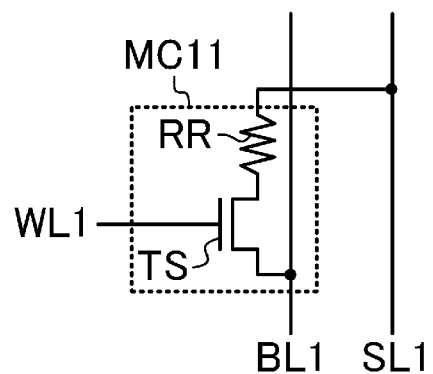
FIG. 3 is a circuit diagram illustrating an example configuration of a memory cell.

Next, with reference to FIGS. 3 and 4, configurations of the memory cells MC11-MCmn will be described. Since the memory cells MC11-MCmn have the same configuration, the configuration of the memory cell MC11 will be described as an example. The memory cell MC11 includes a selection transistor TS and a variable resistance element RR (memory element). The gate of the selection transistor TS is connected to the word line WL1 corresponding to the memory cell MC11. The selection transistor TS is in the on sate when the word line WL1 is activated, and the selection transistor TS is in the off state when the word line WL1 is deactivated. The variable resistance element RR is connected to the selection transistor TS in series between the bit line BL1 corresponding to the memory cell MC11 and the source line SL1 corresponding to the memory cell MC11. Thus, the memory cell MC11 is formed by a 1T1R-type variable resistance memory cell including one selection transistor TS and one variable resistance element RR.

Figure 4:
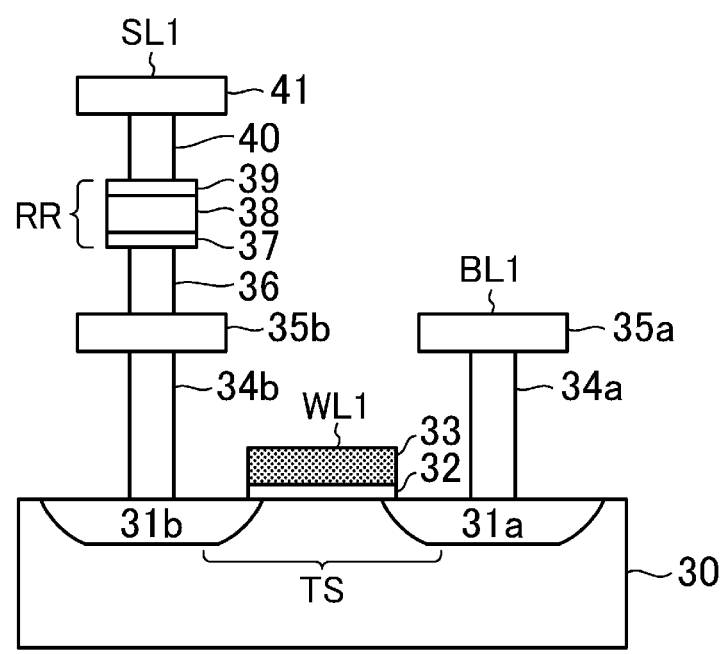
FIG. 4 is a cross-sectional view illustrating the example configuration of the memory cell.

For example, as illustrated in FIG. 4, the selection transistor TS includes diffusion regions 31a and 31b formed on a semiconductor substrate 30, an oxide film 32, and a gate electrode 33 (i.e., the word line WL1). The oxide film 32 is formed on a region serving as a channel region of the selection transistor TS (a region between the diffusion regions 31a and 31b). The gate electrode 33 is made of polysilicon. The diffusion region 31a (i.e., a drain terminal of the selection transistor TS) is connected to a first interconnect layer 35a (i.e., the bit line BL1) by a via 34a. The diffusion region 31b (i.e., a source terminal of the selection transistor TS) is connected to a first interconnect layer 35b by a via 34b. The first interconnect layer 35b is connected to the variable resistance element RR by a via 36. The variable resistance element RR includes a lower electrode 37, a variable resistance layer 38, and an upper electrode 39. The variable resistance element RR is connected to a second interconnect layer 41 (i.e., the source line SL1) by a via 40.

[Variable Resistance Element]

Next, the variable resistance element RR will be described. The resistance state of the variable resistance element RR varies depending on a pulse voltage applied between the upper electrode 39 and the lower electrode 37 of the variable resistance element RR. Here, the resistance state of the variable resistance element RR changes from a "low resistance state" to a "high resistance state" when a pulse voltage higher than a predetermined threshold voltage is applied between the upper electrode 39 and the lower electrode 37 of the variable resistance element RR so that the upper electrode 39 of the variable resistance element RR is positive relative to the lower electrode 37, and changes from the "high resistance state" to the "low resistance state" when a pulse voltage higher than the threshold voltage is applied between the upper electrode 39 and the lower electrode 37 of the variable resistance element RR so that the upper electrode 39 of the variable resistance element RR is negative relative to the lower electrode 37. Moreover, when the voltage applied between the upper electrode 39 and the lower electrode 37 of the variable resistance element RR is lower than the threshold voltage, the resistance state of the variable resistance element RR does not change, and a current corresponding to the resistance state of the variable resistance element RR is generated. That is, when data values are assigned to the resistance states of the variable resistance element RR, the variable resistance element RR can be used as a memory element for storing a data value.

Note that, in the following description, for convenience sake, "1" (first value) is assigned to the low resistance state of the variable resistance element RR, "0" (second value) is assigned to the high resistance state of the variable resistance element RR, and the memory cells MC11-MCmn each store a one-bit data value. Moreover, the voltage difference between the rewrite voltage Vwrite and the reference voltage VS S is larger than the threshold voltage of the variable resistance element RR (a minimum voltage which allows the resistance state of the variable resistance element RR to change), and the voltage difference between the read voltage Vread and the reference voltage VSS is smaller than the threshold voltage of the variable resistance element RR.

[Operations on Memory Cell]

Next, with reference to FIG. 5, a reset operation, a set operation, and a read operation performed on a memory cell will be described. Here, for simplicity of illustration, the memory cells MC11-MCmn, the word lines WL1-WLm, the bit lines BL1-BLn, and the source lines SL1-SLn are collectively referred to as "memory cell(s) MC," "word line(s) WL," "bit line(s) BL," and "source line(s) SL," respectively. Note that the reset operation and the set operation may also be referred to as a program operation and an erase operation, respectively.

<<Reset Operation (Program Operation)>>

The reset operation (program operation) refers to the operation of changing the resistance state of the variable resistance element RR of the memory cell MC from the low resistance state to the high resistance state (increasing the resistance) to change the data value stored in the memory cell MC from "1" to "0." In the case of the reset operation, an activating voltage VH (a voltage, for example, 1.8 V, which can turn on the selection transistor TS) is applied to the word line WL connected to the memory cell MC, thereby turning on the selection transistor TS of the memory cell MC. Moreover, the reference voltage VSS (e.g., 0 V) and the rewrite voltage Vwrite (e.g., 1.8 V) are applied to the bit line BL and the source line SL, respectively. This means that a pulse voltage higher than the threshold voltage is applied between the upper electrode 39 and the lower electrode 37 of the variable resistance element RR so that the upper electrode 39 of the variable resistance element RR is positive relative to the lower electrode 37. Thus, the resistance state of the variable resistance element RR changes from the low resistance state to the high resistance state. That is, the data value stored in the memory cell MC is thus changed from "1" to "0."

<<Set Operation (Erase Operation)>>

The set operation (erase operation) refers to the operation of changing the resistance state of the variable resistance element RR of the memory cell MC from the high resistance state to the low resistance state (reducing the resistance) to change the data value stored in the memory cell MC from "0" to "1." In the case of the set operation, the activating voltage VH is applied to the word line WL connected to the memory cell MC, thereby turning on the selection transistor TS of the memory cell MC. Moreover, the rewrite voltage Vwrite and the reference voltage VSS are applied to the bit line BL and the source line SL, respectively. This means that a pulse voltage higher than the threshold voltage is applied between the upper electrode 39 and the lower electrode 37 of the variable resistance element RR so that the upper electrode 39 of the variable resistance element RR is negative relative to the lower electrode 37. Thus, the resistance state of the variable resistance element RR changes from the high resistance state to the low resistance state. That is, the data value stored in the memory cell MC is thus changed from "0" to "1."

<<Read Operation>>

The read operation refers to the operation of generating a memory cell current based on the resistance state of the variable resistance element RR of the memory cell MC, and determining the data value stored in the memory cell MC based on the current value of the memory cell current. In the case of the read operation, the activating voltage VH is applied to the word line WL connected to the memory cell MC, thereby turning on the selection transistor TS of the memory cell MC. Moreover, a read voltage Vread (e.g., 0.4 V) and the reference voltage VSS are applied to the bit line BL and the source line SL, respectively. In this case, since the voltage applied between the upper electrode 39 and the lower electrode 37 of the variable resistance element RR is lower than the threshold voltage, a memory cell current according to the resistance state of the variable resistance element RR is generated in the bit line BL1. When the resistance state of the variable resistance element RR is the "low resistance state," the current value of the memory cell current is higher than a preset reference value, and when the resistance state of the variable resistance element RR is the "high resistance state," the current value of the memory cell current is lower than the reference value. Thus, whether the data value stored in the memory cell MC is "1" or "0" can be determined by comparing the current value of the memory cell current with the reference value. For example, when the current value of the memory cell current is higher than the reference value, the data value stored in the memory cell MC is determined to be "1," and when the current value of the memory cell current is lower than the reference value, the data value stored in the memory cell MC is determined to be "0."

[Operations by Nonvolatile Semiconductor Memory Device]

Next, with reference to FIGS. 6-11, operations by the nonvolatile semiconductor memory device (operations performed on each of memory blocks) will be described. Here, an example in which the memory cell MC11 is accessed will be described.

<<Reset Operation (Program Operation)>>

Figures 5, 6:
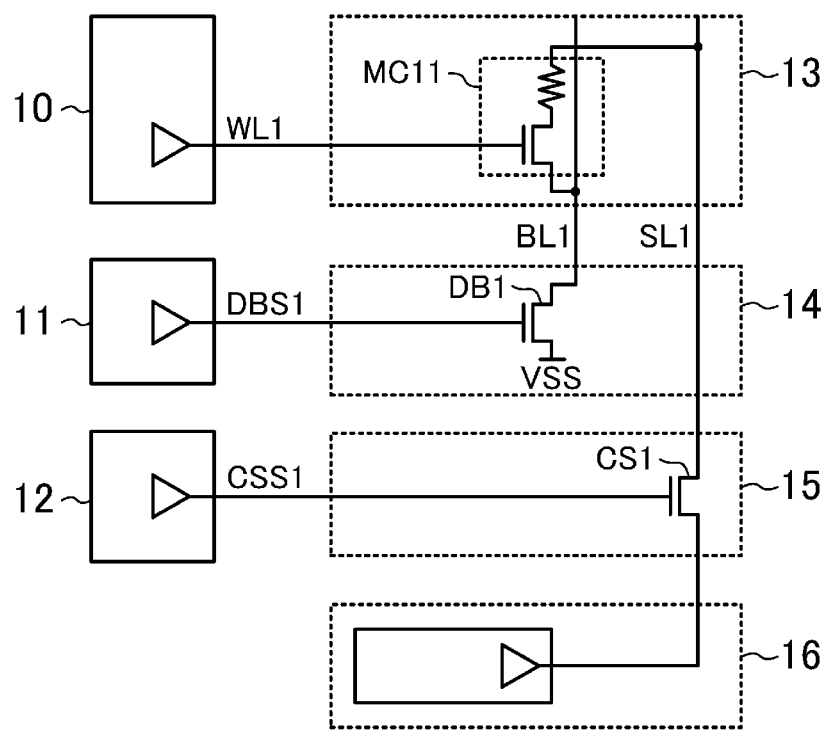
FIG. 5 is a view illustrating a reset operation, a set operation, and a read operation on the memory cell.
FIG. 6 is a view illustrating a connection state of the memory cell in the reset operation by the nonvolatile semiconductor memory device.

The word line decoder/driver 10 supplies the activating voltage VH to the word line WL1, thereby turning on the selection transistor TS of the memory cell MC11. The discharge decoder/driver 11 activates the discharge control signal DBS1 and deactivates the discharge control signal DSS1. The column decoder/driver 12 deactivates the column control signal CBS1 and activates the column control signal CSS1. Thus, on/off states of the discharge transistor DB1 and the column transistor CB1 corresponding to the bit line BL1 connected to the memory cell MC11, and the discharge transistor DS1 and the column transistor CS1 corresponding to the source line SL1 connected to the memory cell MC11 are represented as follows:

Discharge transistor DB1: on state
Discharge transistor DS1: off state
Column transistor CB1: off state
Column transistor CS1: on state Thus, since the discharge transistor DB1 and the column transistor CS1 are in the on state, as illustrated in FIG. 6, the bit line BL1 is connected to the reference node, and the source line SL1 is connected to the write driver 16. Moreover, the write driver 16 supplies the rewrite voltage Vwrite. Thus, the reference voltage VSS is applied to the bit line BL1, and the rewrite voltage Vwrite is applied to the source line SL1. As a result, a pulse voltage (Vwrite−VSS) is applied between the source line SL1 and the bit line BL1, and thus the resistance state of the variable resistance element RR included in the memory cell MC11 changes from the low resistance state to the high resistance state. That is, the data value of the memory cell MC11 can be changed from "1" to "0." Moreover, the discharge transistor DS1 and the column transistor CB1 are in the off state, so that short circuiting between the write driver 16 and the reference node can be prevented.

Figure 7:
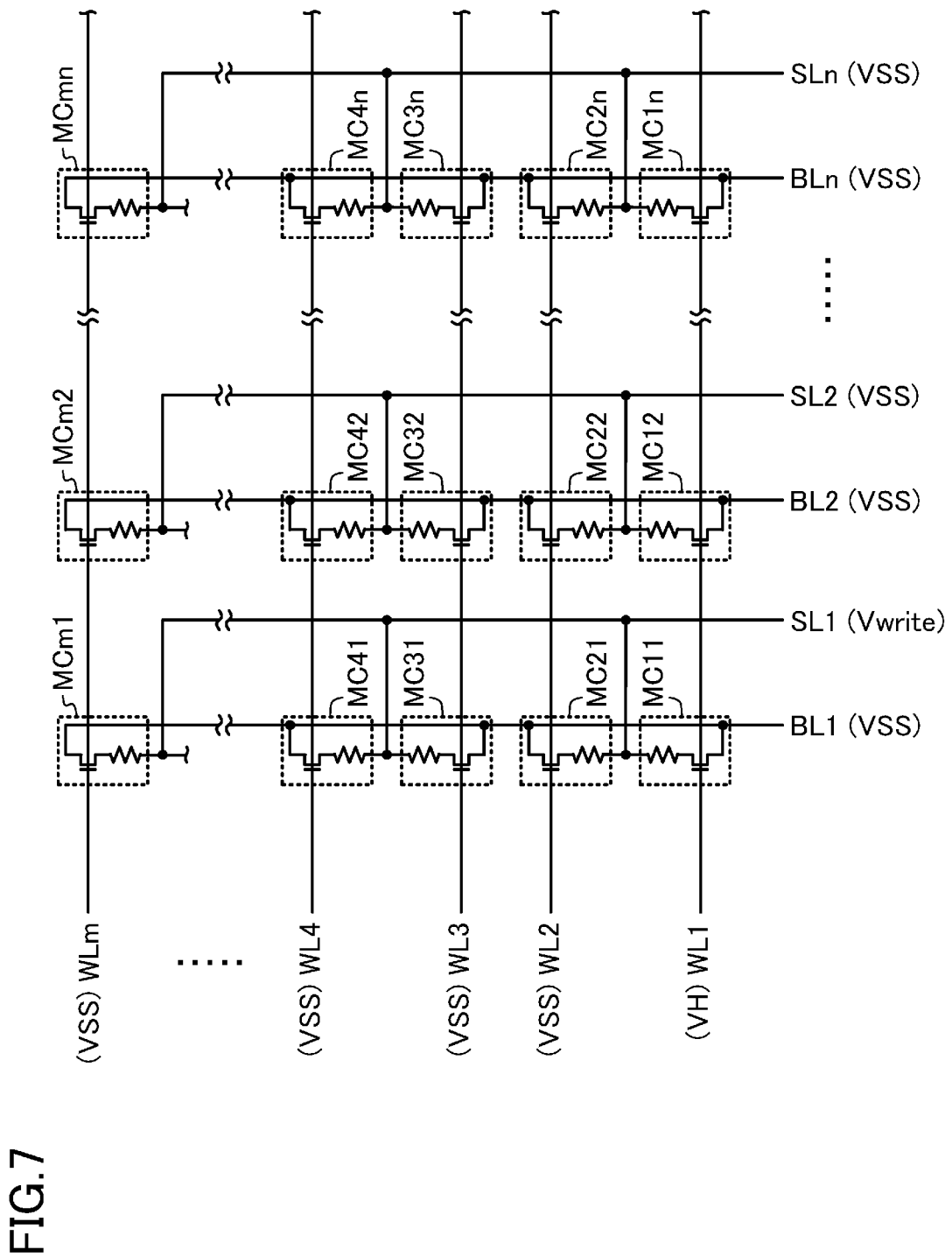
FIG. 7 is a view illustrating voltages applied to word lines, bit lines, and source lines in the reset operation by the nonvolatile semiconductor memory device.

Moreover, the discharge decoder/driver 11 activates the discharge control signals DBS2-DBSn and DSS2-DSSn, and the column decoder/driver 12 deactivates the column control signals CBS2-CBSn and CSS2-CSSn. Thus, on/off states of the discharge transistors DB2-DBn and the column transistors CB2-CBn which do not correspond to the bit line BL1 connected to the memory cell MC11, and the discharge transistors DS2-DSn and the column transistors CS2-CSn which do not correspond to the source line SL1 connected to the memory cell MC11 are represented as follows:

Discharge transistors DB2-DBn: on state
Discharge transistors DS2-DSn: on state
Column transistors CB2-CBn: off state
Column transistors CS2-CSn: off state Thus, as illustrated in FIG. 7, the reference voltage VSS is applied to the bit lines BL2-BLn and the source lines SL2-SLn which are not connected to the memory cell MC11. Therefore, in each of (n−1) memory cells MC12-MC1n connected to the word line WL1, the selection transistor TS is in the on state, but voltages at both ends of the variable resistance element RR are equal to each other. Thus, the data value stored in each of the memory cells MC12-MC1n is not changed. In this way, the data value stored in each of the memory cells MC12-MCmn which are not target cells of the reset operation can be prevented from being changed.

Moreover, after completion of the reset operation, the discharge decoder/driver 11 activates the discharge control signals DBS1-DBSn and DSS1-DSSn, and the column decoder/driver 12 deactivates the column control signals CBS1-CBSn and CSS1-CSSn. Consequently, on/off states of the discharge transistors DB1-DBn and DS1-DSn and the column transistors CB1-CBn and CS1-CSn are represented as follows:

Discharge transistors DB1-DBn: on state
Discharge transistors DS1-DSn: on state
Column transistors CB1-CBn: off state
Column transistors CS1-CSn: off state Thus, the reference voltage VSS is applied to the bit lines BL1-BLn and the source lines SL1-SLn. Therefore, voltage fluctuations of the bit lines BL1-BLn and the source lines SL1-SLn due to disturbing noise, etc. can be reduced. As a result, it is possible to reduce erroneous changes of the data values stored in the memory cells MC11-MCmn.

<<Set Operation (Erase Operation)>>

Figure 8:
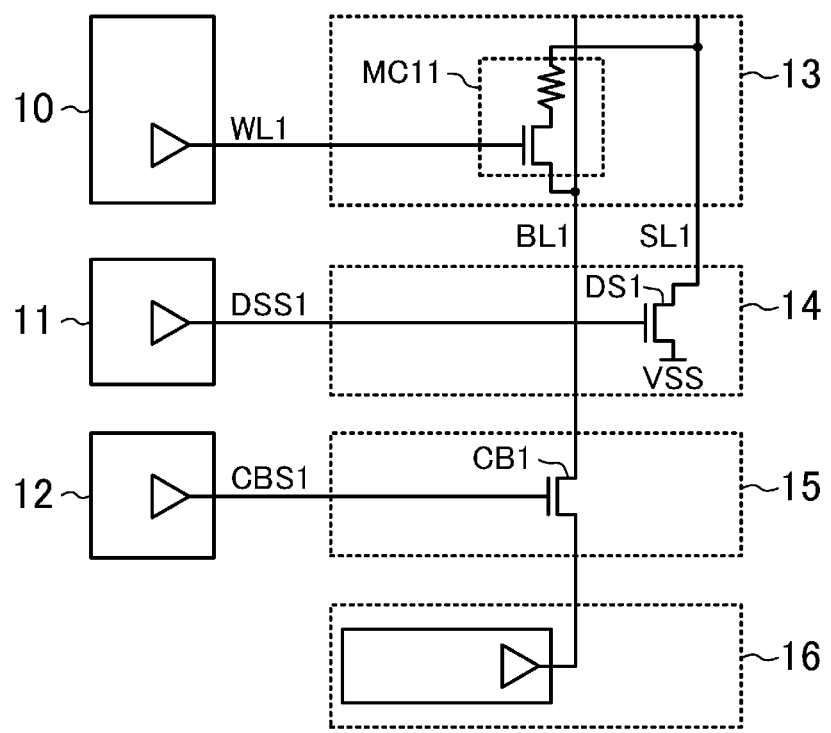
FIG. 8 is a view illustrating a connection state of the memory cell in the set operation by the nonvolatile semiconductor memory device.

The word line decoder/driver 10 supplies the activating voltage VH to the word line WL1, thereby turning on the selection transistor TS of the memory cell MC11. The discharge decoder/driver 11 deactivates the discharge control signal DBS1 and activates the discharge control signal DSS1. The column decoder/driver 12 activates the column control signal CBS1 and deactivates the column control signal CSS1. Thus, on/off states of the discharge transistor DB1 and the column transistor CB1 corresponding to the bit line BL1 connected to the memory cell MC11, and the discharge transistor DS1 and the column transistor CS1 corresponding to the source line SL1 connected to the memory cell MC11 are represented as follows:

Discharge transistor DB1: off state
Discharge transistor DS1: on state
Column transistor CB1: on state
Column transistor CS1: off state Thus, since the discharge transistor DS1 and the column transistor CB1 are in the on state, as illustrated in FIG. 8, the bit line BL1 is connected to the write driver 16, and the source line SL1 is connected to the reference node. Moreover, the write driver 16 supplies the rewrite voltage Vwrite. Thus, the rewrite voltage Vwrite is applied to the bit line BL1, and the reference voltage VSS is applied to the source line SL1. As a result, a pulse voltage (VSS−Vwrite) is applied between the source line SL1 and the bit line BL1, and thus the resistance state of the variable resistance element RR included in the memory cell MC11 changes from the high resistance state to the low resistance state. That is, the data value of the memory cell MC11 can be changed from "0" to "1." Moreover, the discharge transistor DB1 and the column transistor CS1 are in the off state, so that short circuiting between the write driver 16 and the reference node can be prevented.

Figure 9:
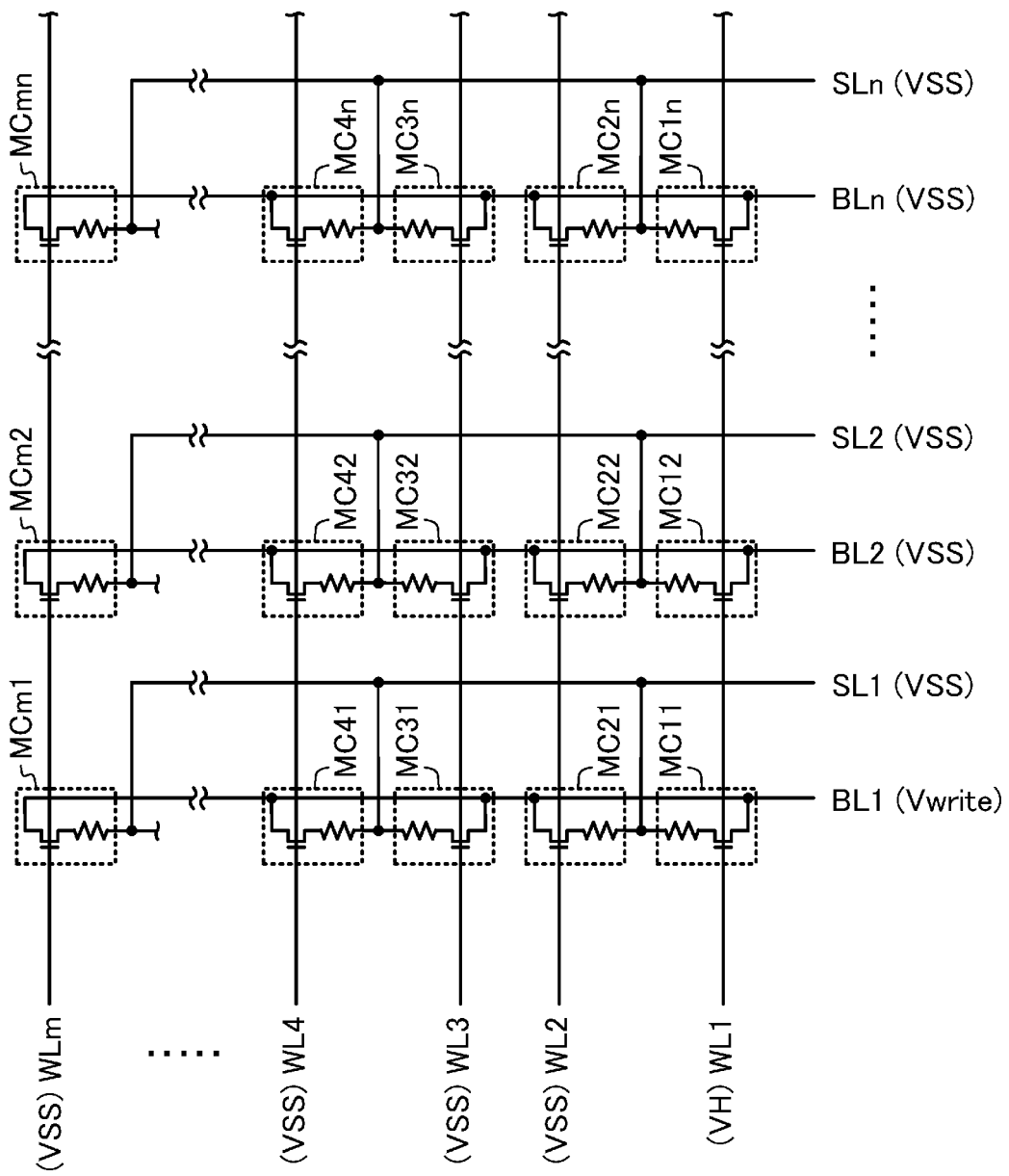
FIG. 9 is a view illustrating voltages applied to the word lines, the bit lines, and the source lines in the set operation by the nonvolatile semiconductor memory device.

Moreover, in the same manner as the reset operation, the discharge decoder/driver 11 activates the discharge control signals DBS2-DBSn and DSS2-DSSn, and the column decoder/driver 12 deactivates the column control signals CBS2-CBSn and CSS2-CSSn. Thus, as illustrated in FIG. 9, the reference voltage VSS is applied to the bit lines BL2-BLn and the source lines SL2-SLn which are not connected to the memory cell MC11. In this way, the data value stored in each of the memory cells MC12-MCmn which are not target cells of the set operation can be prevented from being changed.

Moreover, in the same manner as after the completion of the reset operation, after completion of the set operation, the discharge decoder/driver 11 activates the discharge control signals DBS1-DBSn and DSS1-DSSn, and the column decoder/driver 12 deactivates the column control signals CBS1-CBSn and CSS1-CSSn. Consequently, the reference voltage VSS is applied to the bit lines BL1-BLn and the source lines SL1-SLn.

<<Read Operation>>

Figure 10:
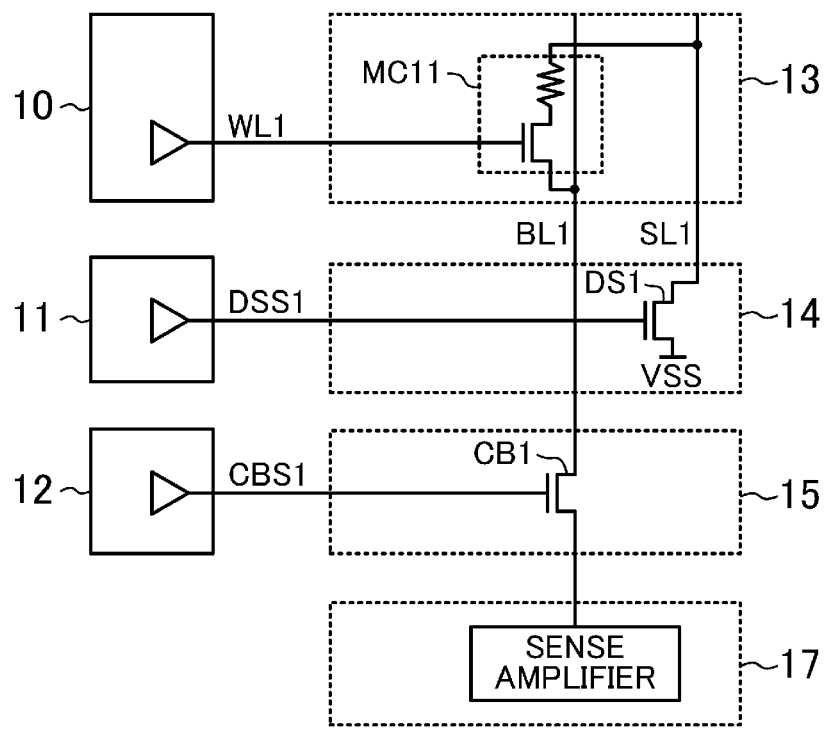
FIG. 10 is a view illustrating a connection state of the memory cell in the read operation by the nonvolatile semiconductor memory device.

The word line decoder/driver 10 supplies the activating voltage VH to the word line WL1, thereby turning on the selection transistor TS of the memory cell MC11. The discharge decoder/driver 11 deactivates the discharge control signal DBS1 and activates the discharge control signal DSS1. The column decoder/driver 12 activates the column control signal CBS1 and deactivates the column control signal CSS1. Thus, on/off states of the discharge transistor DB1 and the column transistor CB1 corresponding to the bit line BL1 connected to the memory cell MC11, and the discharge transistor DS1 and the column transistor CS1 corresponding to the source line SL1 connected to the memory cell MC11 are represented as follows:

Discharge transistor DB1: off state
Discharge transistor DS1: on state
Column transistor CB1: on state
Column transistor CS1: off state Thus, since the discharge transistor DS1 and the column transistor CB1 are in the on state, as illustrated in FIG. 10, the bit line BL1 is connected to the sense amplifier 17, and the source line SL1 is connected to the reference node. Moreover, the sense amplifier 17 supplies the read voltage Vread. Thus, the read voltage Vread is applied to the bit line BL1, and the reference voltage VSS is applied to the source line SL1. As a result, a memory cell current according to the data value stored in the memory cell MC11 (here, a memory cell current according to the resistance state of the variable resistance element RR) is generated in the bit line BL1, and the sense amplifier 17 determines the data value stored in the memory cell MC11 based on the current value of the memory cell current. For example, when the current value of the memory cell current generated in the bit line BL1 is higher than the reference value, the sense amplifier 17 determines the data value stored in the memory cell MC11 to be "1," whereas when the current value of the memory cell current generated in the bit line BL1 is lower than the reference value, the sense amplifier 17 determines the data value stored in the memory cell MC11 to be "0." Moreover, the discharge transistor DB1 and the column transistor CS1 are in the off state, so that short circuiting between the sense amplifier 17 and the reference node can be prevented.

Figure 11:
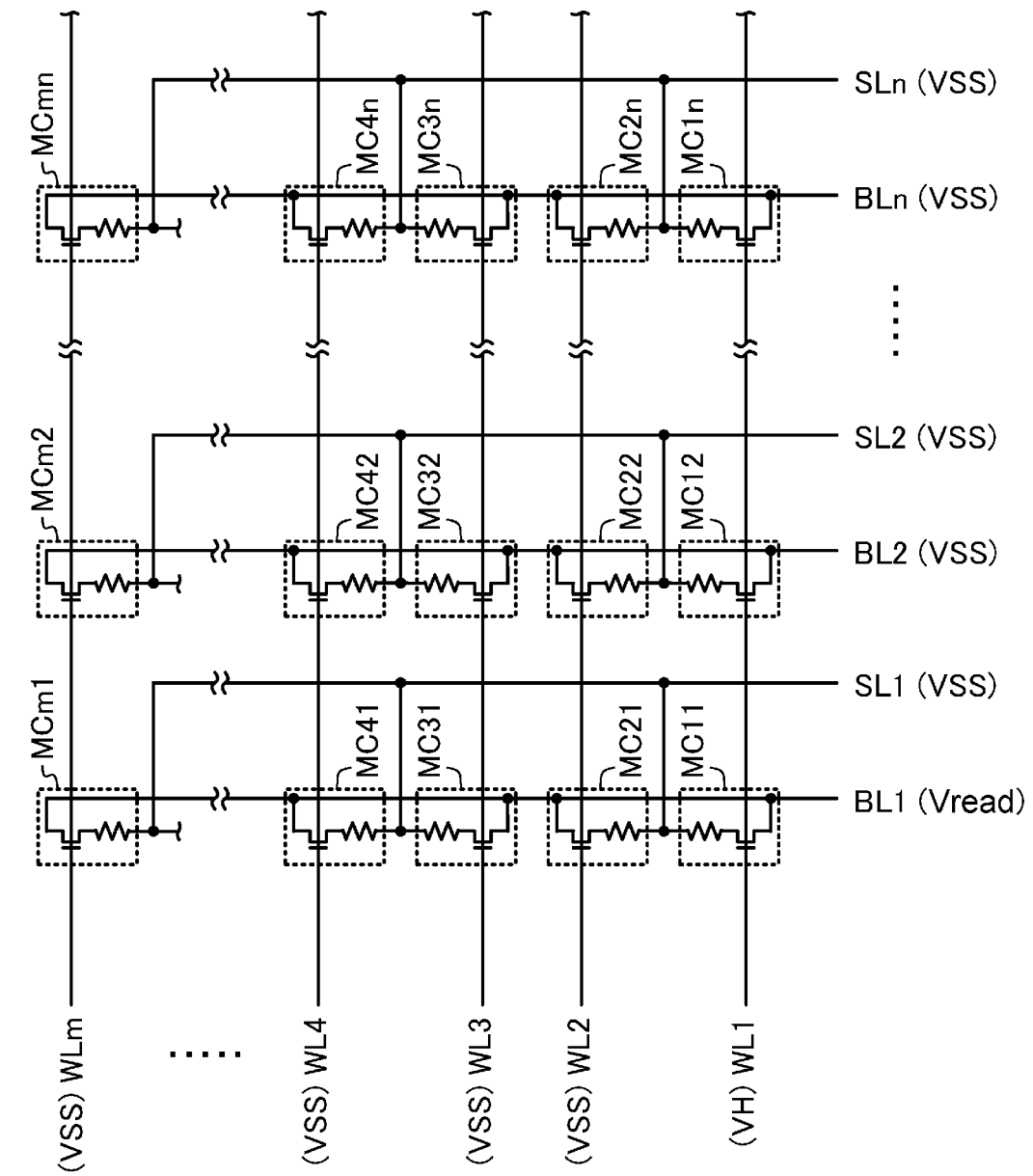
FIG. 11 is a view illustrating voltages applied to the word lines, the bit lines, and the source lines in the read operation by the nonvolatile semiconductor memory device.

In the same manner as the reset operation and the set operation, the discharge decoder/driver 11 activates the discharge control signals DBS2-DBSn and DSS2-DSSn, and the column decoder/driver 12 deactivates the column control signals CBS2-CBSn and CSS2-CSSn. As a result, as illustrated in FIG. 11, the reference voltage VSS is applied to the bit lines BL2-BLn and the source lines SL2-SLn which are not connected to the memory cell MC11. Therefore, in each of (n−1) memory cells MC12-MC1n connected to the word line WL1, the selection transistor TS is in the on state, but voltages at both ends of the variable resistance element RR are equal to each other. Thus, a memory cell current according to the data value stored in each of the memory cells MC12-MC1n is not generated. In this way, it is possible to prevent generation of a memory cell current according to the data value stored in each of the memory cells MC12-MCmn which are not target cells of the read operation.

Moreover, in the same manner as after the completion of the reset operation and the completion of the set operation, after completion of the read operation, the discharge decoder/driver 11 activates the discharge control signals DBS1-DBSn and DSS1-DSSn, and the column decoder/driver 12 deactivates the column control signals CBS1-CBSn and CSS1-CSSn. Consequently, the reference voltage VSS is applied to the bit lines BL1-BLn and the source lines SL1-SLn.

[Multi-Bit Simultaneous Processing Operation]

The nonvolatile semiconductor memory device illustrated in FIG. 1 can perform the reset operation, the set operation, and the read operation on each memory block. That is, the nonvolatile semiconductor memory device can simultaneously perform a processing operation (the reset operation, the set operation, and the read operation) on the p memory blocks 181-18p.

Next, with reference to FIGS. 12 and 13, a multi-bit simultaneous processing operation by the nonvolatile semiconductor memory device illustrated in FIG. 1 will be described. Note that in FIGS. 12 and 13, only the memory cells MC11 on which the processing operation is performed by the nonvolatile semiconductor memory device, the word line WL1, the bit lines BL1, and the source lines SL1 are illustrated, and the column gate circuits 15 and the sense amplifiers 17 are omitted for the sake of the simplicity.

<<Operation of Simultaneously Resetting a Plurality of Bits>>

Figure 12:
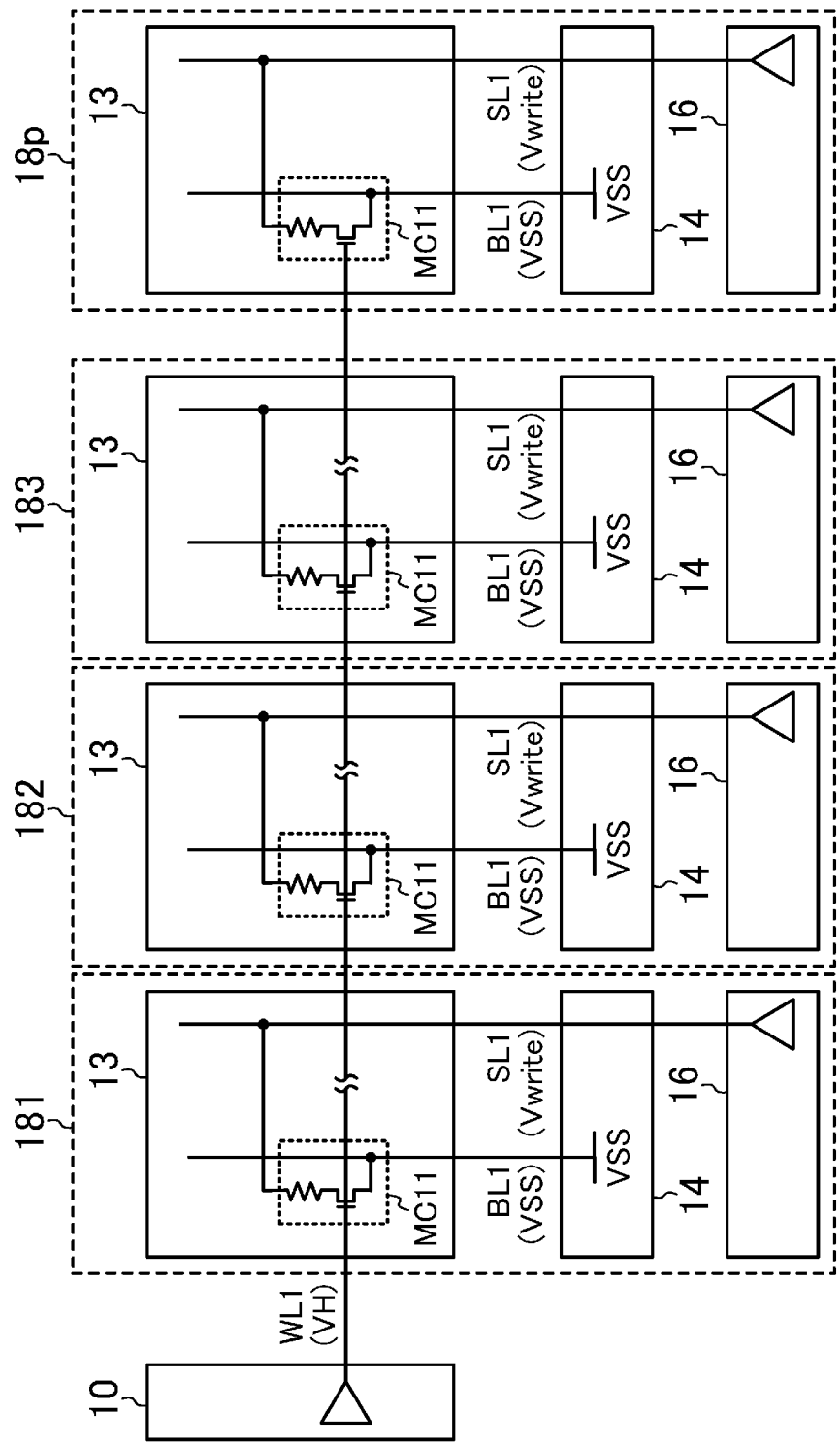
FIG. 12 is a view illustrating a multi-bit simultaneous processing operation (operation of simultaneously resetting a plurality of bits) by the nonvolatile semiconductor memory device of FIG. 1.

FIG. 12 illustrates a case where the reset operation is simultaneously performed on the memory cells MC11 included in the memory blocks 181-18p in the nonvolatile semiconductor memory device illustrated in FIG. 1. In this case, the word line decoder/driver 10 activates the word line WL1 (supplies the activating voltage VH to the word line WL1). Moreover, in each of the memory blocks 181-18p, the bit line BL1 and the source line SL1 are connected to the reference node and the write driver 16, respectively, and the write driver 16 supplies the rewrite voltage Vwrite. Thus, in each of the memory blocks 181-18p, the data value stored in the memory cell MC11 is changed from "1" to "0."

<<Operation of Resetting Only One Bit>>

Figure 13:
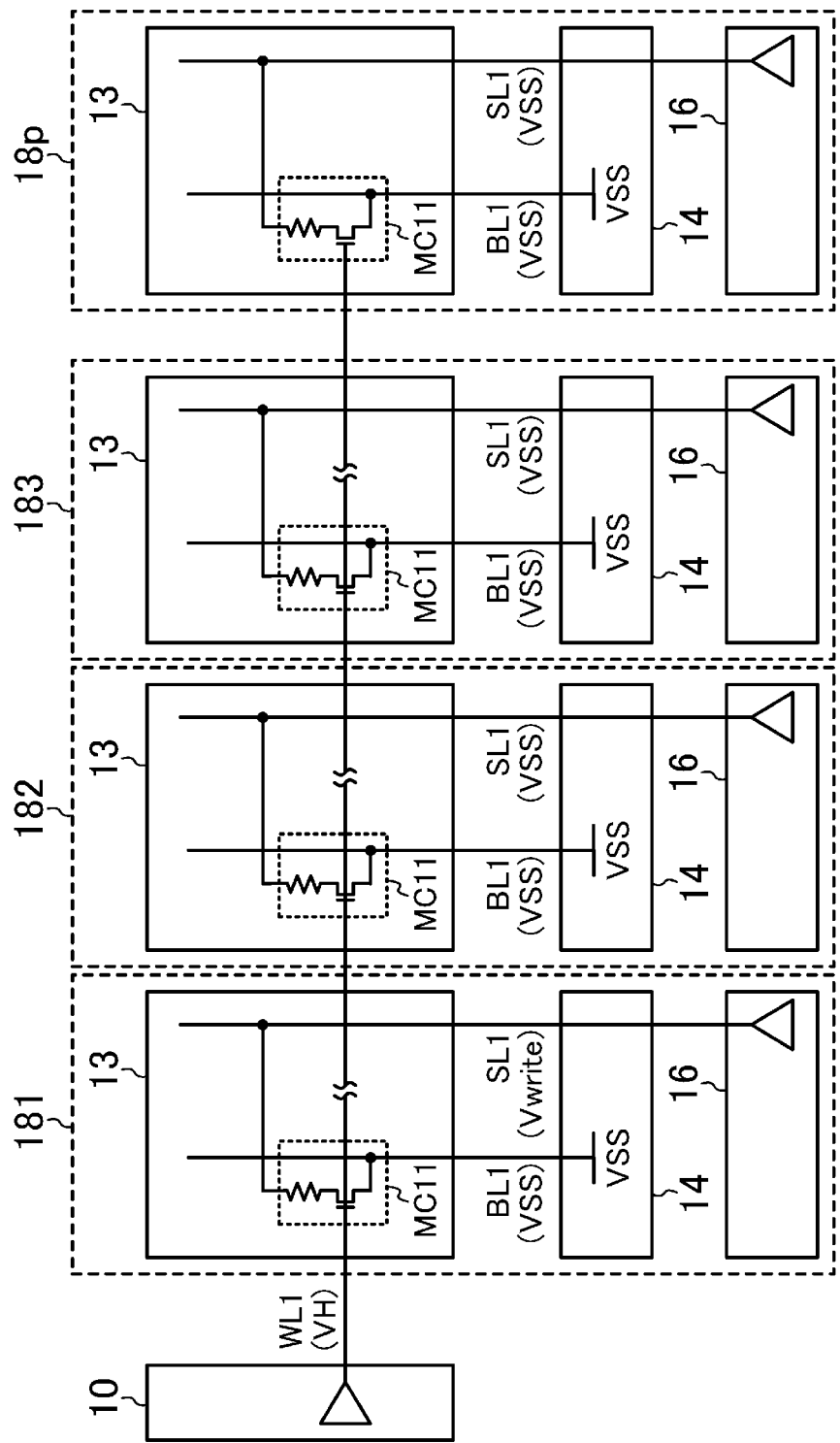
FIG. 13 is a view illustrating a multi-bit simultaneous processing operation (operation of resetting only one bit) by the nonvolatile semiconductor memory device of FIG. 1.
Figure 14:
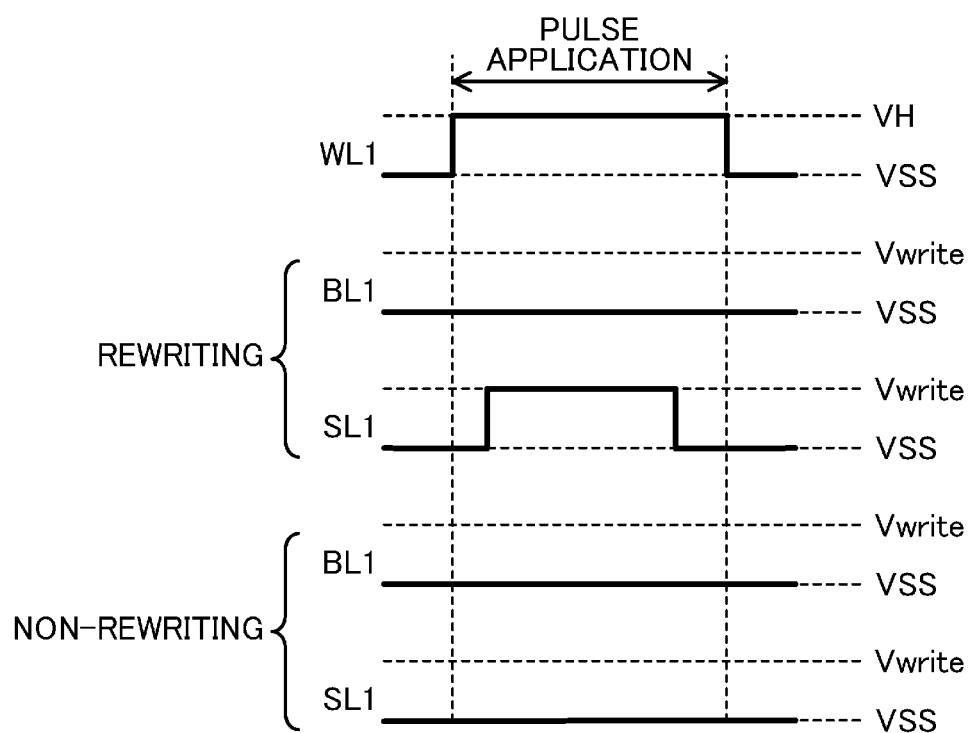
FIG. 14 is a view illustrating changes of the voltages of the word line, the bit line, and the source line in the multi-bit simultaneous processing operation (operation of resetting only one bit) by the nonvolatile semiconductor memory device of FIG. 1.

FIG. 13 illustrates a case where the reset operation is performed on the memory cell MC11 included in the memory block 181 in the nonvolatile semiconductor memory device illustrated in FIG. 1, whereas the rewrite operation (the reset operation, the set operation) is not performed on the memory cells MC11 included in the memory blocks 182-18p. In this case, the word line decoder/driver 10 activates the word line WL1 (supplies the activating voltage VH to the word line WL1). Moreover, in each of the memory blocks 181-18p, the bit line BL1 and the source line SL1 are connected to the reference node and the write driver 16, respectively. Moreover, the write driver 16 of the memory block 181 supplies the rewrite voltage Vwrite. On the other hand, the write driver 16 of each of the memory blocks 182-18p supplies the reference voltage VSS. That is, as illustrated in FIG. 14, the rewrite voltage Vwrite is applied to the source line SL1 in the target memory block 181 of the reset operation, whereas the reference voltage VSS remains applied to the source line SL1 in each of the memory blocks 182-18p which are not target blocks of the rewrite operation. Therefore, the data value stored in the memory cell MC11 in the memory block 181 is changed from "1" to "0," whereas the data value stored in the memory cell MC11 in each of the memory blocks 182-18p is not changed.

[Comparative Example]

Here, with reference to FIGS. 15 and 16, a comparative example (a nonvolatile semiconductor memory device in which each of a plurality of source lines is commonly connected to a plurality of memory cells commonly connected to one word line) of the nonvolatile semiconductor memory device illustrated in FIG. 1 will be described. Note that in FIGS. 15 and 16, for the sake of the simplicity, only a word line WL1 and a source line SL1 of the word lines and the source lines are illustrated. In each of p memory blocks 951-95p, only a bit line BL1 of a plurality of bit lines is illustrated, and only a memory cell MC11 (a memory cell connected to the word line WL1, the source line SL1, and the bit line BL1) of the memory cells included in a memory cell array 93 is illustrated. In each of the memory blocks 951-95p, a column gate circuit and a sense amplifier are omitted.

Figure 15:
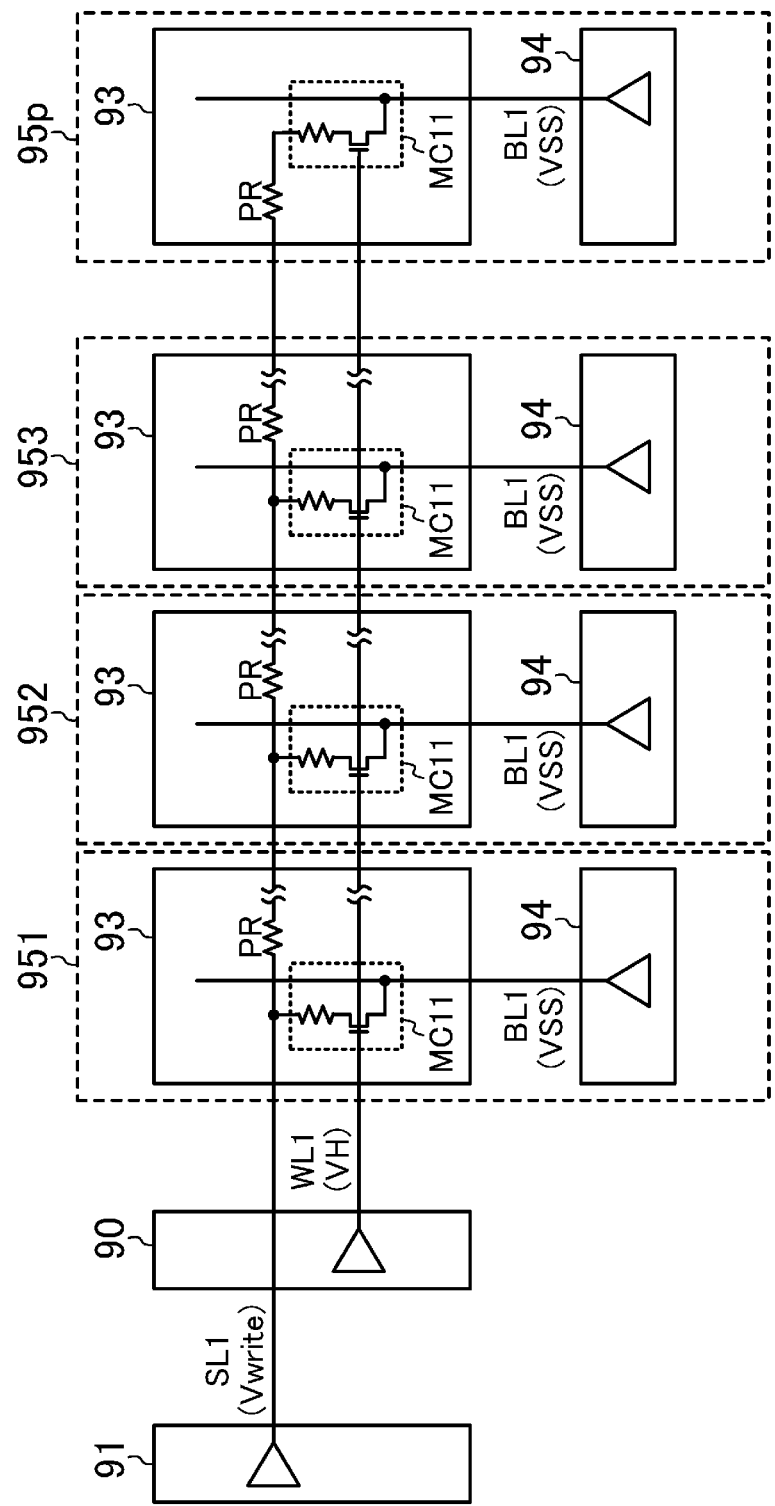
FIG. 15 is a view illustrating a multi-bit simultaneous processing operation (operation of simultaneously resetting a plurality of bits) by a nonvolatile semiconductor memory device in which each of source lines is commonly connected to a plurality of memory cells commonly connected to one word line.
Figure 16:
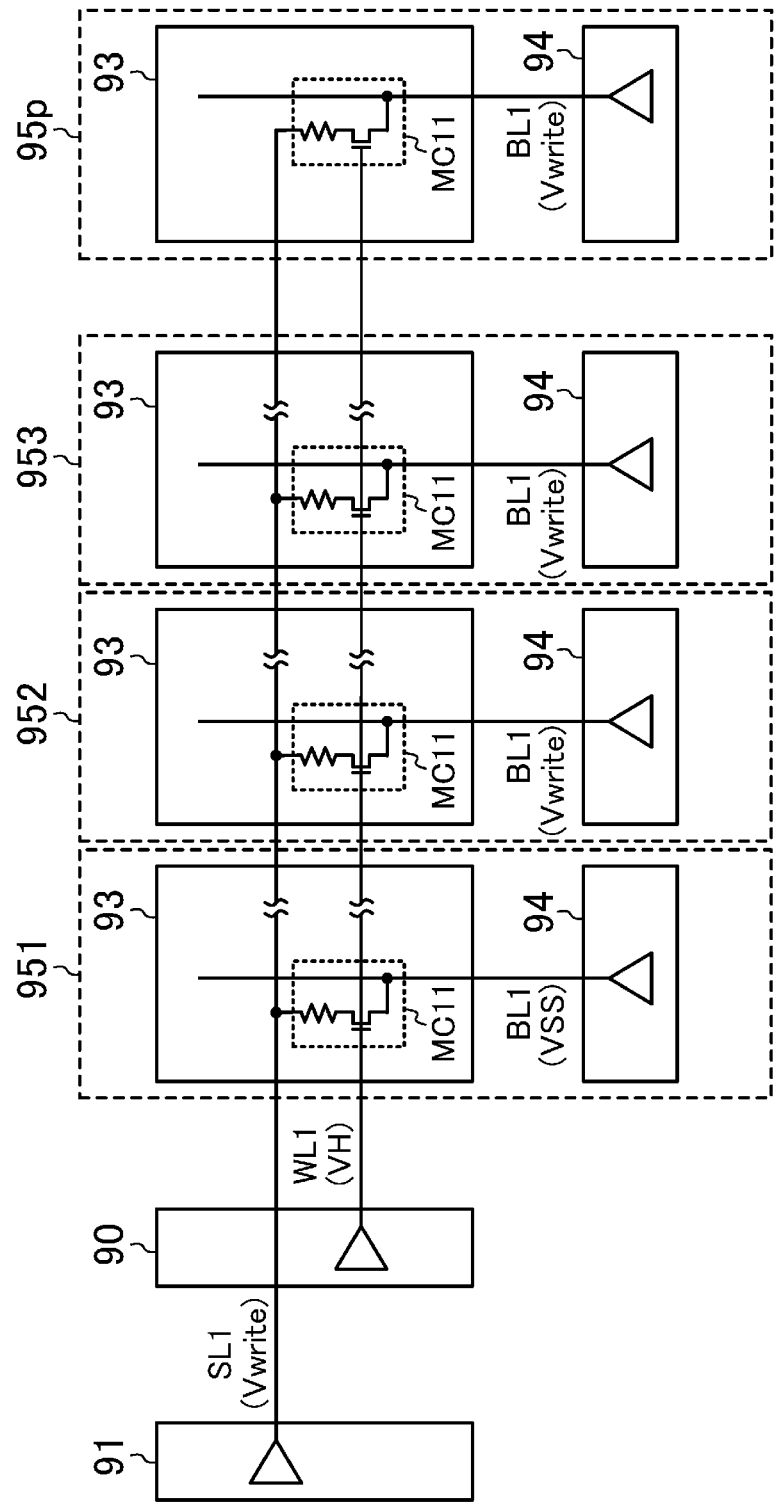
FIG. 16 is a view illustrating a multi-bit simultaneous processing operation (operation of resetting only one bit) by the nonvolatile semiconductor memory device in which each of source lines is commonly connected to a plurality of memory cells commonly connected to one word line.

In the nonvolatile semiconductor memory device illustrated in FIGS. 15 and 16, a word line driver 90 selectively supplies an activating voltage VH to the word lines. A source driver 91 selectively supplies a voltage required for the rewrite operation (a rewrite voltage Vwrite, a ground voltage VSS) to the source lines. Each of the p memory blocks 951-95p includes the memory cell array 93, the bit lines, a column gate circuit, a write driver 94, and a sense amplifier.

The memory cell array 93 includes the plurality of memory cells disposed in rows and columns. Each of the word lines corresponds to a different one of the rows of the memory cell array 93, and each of the source lines corresponds to a different one of the rows of the memory cell array 93. Each bit line corresponds to an associated one of the columns of the memory cell array 93. That is, the source lines and the word lines are disposed in the row direction parallel to each other, and the bit lines are disposed in the column direction parallel to each other. Moreover, each source line is commonly connected to the memory cells commonly connected to the word line. For example, the first-row source line SL1 is commonly connected to the memory cells connected to the first-row word line WL1 (here, only first-row, first-column memory cells MC11, MC11, . . . , MC11 are shown). Moreover, each bit line is separately connected to a different one of the memory cells commonly connected to the word line. For example, the first-column bit line BL1 is commonly connected to the first-column memory cells (here, only memory cells MC11 are shown).

The column gate circuit connects one of the bit lines to the write driver 94 (or the sense amplifier). The write driver 94 selectively supplies a voltage required for the rewrite operation (the rewrite voltage Vwrite, the ground voltage VSS).

<<Operation of Simultaneously Resetting a Plurality of Bits>>

When the reset operation is simultaneously performed on the memory cells MC11 included in the memory blocks 951-95p in the nonvolatile semiconductor memory device illustrated in FIG. 15, the word line driver 90 supplies an activating voltage VH (e.g., 1.8 V) to the word line WL1, and the source driver 91 supplies a rewrite voltage Vwrite (e.g., 1.8 V) to the source line SL1. Moreover, in each of the memory blocks 951-95p, the write driver 94 supplies a reference voltage VSS (e.g., 0 V). In this way, in each of the memory blocks 951-95p, the data value stored in the memory cell MC11 is changed from "1" to "0."

<<Operation of Resetting Only One Bit>>

Moreover, when in the nonvolatile semiconductor memory device illustrated in FIG. 16, the reset operation is performed on the memory cell MC11 included in the memory block 951, whereas the rewrite operation (the reset operation, the set operation) is not performed on the memory cells MC11 included in the memory blocks 952-95p, the word line driver 90 supplies the activating voltage VH to the word line WL1, and the source driver 91 supplies the rewrite voltage Vwrite to the source line SL1. Moreover, the write driver 94 of the memory block 951 supplies the reference voltage VSS. On the other hand, the write driver 94 of each of the memory blocks 952-95p supplies the rewrite voltage Vwrite. In this way, the data value stored in the memory cell MC11 in the memory block 951 is changed from "1" to "0," whereas the data value stored in the memory cell MC 11 of each of the memory blocks 952-95p is not changed.

Figure 17:
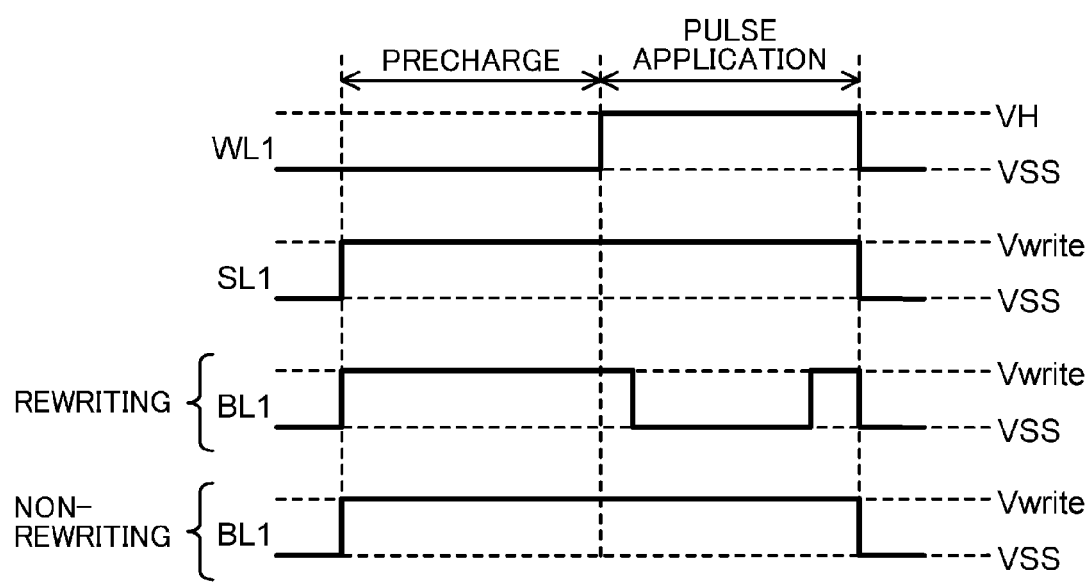
FIG. 17 is a view illustrating changes of the voltages of the word line, the bit line, and the source line in the multi-bit simultaneous processing operation (operation of resetting only one bit) by the nonvolatile semiconductor memory device in which each of source lines is commonly connected to a plurality of memory cells commonly connected to one word line.

Note that as illustrated in FIG. 17, before the activating voltage VH is supplied to the word line WL1, the source driver 91 precharges the source line SL1 to the rewrite voltage Vwrite, and the write driver 94 included in each of the memory blocks 951-95p precharges the bit line BL1 to the rewrite voltage Vwrite, and after the activating voltage VH is supplied to the word line WL1, the write driver 94 included in the target memory block 951 of the reset operation changes a voltage supplied to the bit line BL1 from the rewrite voltage Vwrite to the ground voltage VSS. In this way, no voltage difference is caused between the source line SL1 and the bit line BL1 in each of the memory blocks 952-95p which are not target blocks of the rewrite operation.

[Description of Comparative Example]

However, in the nonvolatile semiconductor memory device illustrated in FIGS. 15 and 16, the source line SL1 is commonly connected to the plurality of memory cells (only memory cells MC11, MC11, . . . , MC11 are shown in FIGS. 15 and 16) commonly connected to the word line WL1. Therefore, when the word line WL1 is activated, the memory cells commonly connected to the word line WL1 are simultaneously selected, and the rewrite voltage Vwrite is supplied to the memory cells via the source line SL1. Thus, the parasitic resistance PR of the source line SL1 and the voltage drop in a source driver 91 reduce the voltage of the source line SL1. As a result, rewrite properties (e.g., the accuracy of the rewrite operation) are deteriorated. The rewrite properties are more significantly deteriorated when the number of memory cells to which a voltage has to be supplied by the source line SL1 is larger. In order to reduce the deterioration in the rewrite properties, the width of the source line may be increased so that voltage drop across the parasitic resistance of the source line is reduced, which however, increases the circuit area of the memory cell array 93, and thus is not preferable. Alternatively, the transistor size of the source driver 91 may be increased, which however, increases the circuit area of the source driver 91, and thus is not preferable.

In particular, as illustrated in FIG. 15, when the reset operation is simultaneously performed on the plurality of memory cells MC11, MC11, . . . , MC11 commonly connected to the word line WL1, the voltage drop across the source line SL1 increases as the distance from the source driver 91 increases, which leads to a further deterioration in the rewrite properties. Thus, the rewrite property varies among the plurality of target memory cells MC11, MC11, . . . , MC11 of the rewrite operation.

Moreover, as illustrated in FIG. 16, when the plurality of memory cells commonly connected to the word line WL1 include both a target memory cell of the rewrite operation and a memory cell which is not a target cell of the rewrite operation, a precharge operation is required so that no voltage difference is caused between the source line SL1 and the bit line BL1 in the memory cell which is not a target cell of the rewrite operation. Therefore, it is difficult to reduce the rewrite time and reduce power consumption.

Moreover, in the nonvolatile semiconductor memory device illustrated in FIGS. 15 and 16, since each bit line is separately connected to a different one of the memory cells commonly connected to the source line SL1, the source driver 91 (driver configured to drive the source line) and the write driver 94 (driver configured to drive the bit line) have to be provided separately. Therefore, it is difficult to reduce the circuit area of the nonvolatile semiconductor memory device.

[Description of the Present Embodiment]

In contrast, in the nonvolatile semiconductor memory device illustrated in FIG. 1, the n bit lines BL1, BL2, . . . , BLn are respectively connected to the n memory cells MC11, MC12, . . . , MC1$n$ connected to the word line WL1, and the n source lines SL1, SL2, . . . , SLn are respectively connected to the n memory cells MC11, MC12, . . . , MC1$n$ connected to the word line WL1. Thus, when the word line WL1 is activated, only one of the memory cells commonly connected to each of the source lines SL1-SLn is selected, and a voltage is transferred to the selected memory cell via the source line (one source line). For example, only the memory cell MC11 is selected among the m memory cells MC11-MCm1 commonly connected to the source line SL1. In this case, the number of memory cells to which a voltage has to be transferred by one source line is smaller than in the case where the source line SL1 is commonly connected to a plurality of memory cells commonly connected to the word line WL1. Thus, it is possible to inhibit a reduction in the voltage of a source line due to the voltage drop across the parasitic resistance of the source line, so that the degradation of the rewrite properties can be reduced.

Moreover, as illustrated in FIG. 12, when the reset operation is simultaneously performed on the plurality of memory cells MC11, MC11, . . . , MC11 commonly connected to the word line WL1, a voltage is transferred to each of the memory cells MC11, MC11, . . . , MC11 by the source line SL1 corresponding to the memory cell MC11. In this case, it is possible to reduce variations of the rewrite property between the plurality of target memory cells MC11, MC11, . . . , MC11 of the rewrite operation compared to the case where the source line SL1 is commonly connected to a plurality of memory cells commonly connected to the word line WL1. Thus, it is possible to increase the number of memory cells simultaneously selected as targets of the rewrite operation (i.e., the number of data values which can be rewritten by a single rewrite operation), so that the rewrite time can be reduced.

Moreover, as illustrated in FIG. 13, even when the plurality of memory cells commonly connected to the word line WL1 include both a target memory cell of the rewrite operation and a memory cell which is not a target memory cell of the rewrite operation, it is not necessary to perform the precharge operation, so that it is possible to reduce time and power required for the precharge operation. Thus, it is possible to reduce the rewrite time and power consumption.

Moreover, in the nonvolatile semiconductor memory device illustrated in FIG. 1, one bit line (e.g., the bit line BL1) is commonly connected to the m memory cells commonly connected to one source line (e.g., the source line SL1), the discharge circuit 14 connects one of the source line and the bit line to the reference node, and the column gate circuit 15 connects the other of the source line and the bit line to the write driver 16, thereby performing the rewrite operation. Thus, it is not necessary to provide a source driver for each of the source lines SL1-SLn, and thus the circuit scale of the nonvolatile semiconductor memory device can be reduced.

(Other Embodiments)

The techniques according to the present disclosure are not limited to these embodiments, but are also applicable to those where modifications, substitutions, additions, and omissions are made.

[Types of Variable Resistance Element]

For example, the variable resistance element RR may be configured such that when a pulse voltage higher than the threshold voltage is applied between the upper electrode 39 and the lower electrode 37 of the variable resistance element RR so that the upper electrode 39 of the variable resistance element RR is negative relative to the lower electrode 37, the resistance state of the variable resistance element RR changes from the "low resistance state" to the "high resistance state," and when a pulse voltage higher than the threshold voltage is applied between the upper electrode 39 and the lower electrode 37 of the variable resistance element RR so that the upper electrode 39 of the variable resistance element RR is positive relative to the lower electrode 37, the resistance state of the variable resistance element RR changes from the "high resistance state" to the "low resistance state."

[Rewrite Voltage, Reference Voltage, Read Voltage]

Note that the rewrite voltage Vwrite may be a positive voltage or a negative voltage. It is not necessary that the reference voltage VSS is the ground voltage (0 V), but the reference voltage VSS may be a positive voltage or a negative voltage. That is, the voltage difference between the rewrite voltage Vwrite and the reference voltage VSS may be larger than the threshold voltage (a minimum voltage allowing the resistance state of the variable resistance element RR to be changed). Alternatively, the read voltage Vread may be a positive voltage or a negative voltage. That is, the voltage difference between the read voltage Vread and the reference voltage VSS may be smaller than the threshold voltage.

[Types of Nonvolatile Semiconductor Memory Device]

Moreover, the nonvolatile semiconductor memory device is not limited to the resistive random access memory (ReRAM), but may be a ferroelectric random access memory (FeRAM), a magnetoresistive random access memory (MRAM), or a phase change random access memory (PRAM). That is, each of the memory cells MC11-MCmn may include a ferroelectric element, a magnetic variable resistance element, or a phase-change element instead of the variable resistance element RR. Thus, each of the memory cells MC11-MCmn may include a memory element whose a data value is changed when the voltage difference between both ends of the memory element is higher than the predetermined threshold voltage.

As described above, the above-described nonvolatile semiconductor memory device can reduce the degradation in the rewrite property, and reduce the rewrite time, power consumption, and circuit scale, and thus is suitable for electronic devices such as mobile phones, portable music players, digital cameras, etc.

What is claimed is:

1. A nonvolatile semiconductor memory device comprising:
    m×n memory cells disposed in m rows and n columns, where m and n are integers greater than or equal to 2;
    m word lines each connected to n memory cells in a corresponding one of the rows of the m×n memory cells;
    n bit lines and n source lines each connected to m memory cells in a corresponding one of the columns of the m×n memory cells;
    a word line drive circuit configured to selectively activate the m word lines;
    a write driver configured to supply a rewrite voltage;
    a first selection circuit including
        n first switching elements each configured to switch a connection state between a reference node to which a reference voltage is applied and a corresponding one of the n bit lines, and
        n second switching elements each configured to switch a connection state between the reference node and a corresponding one of the n source lines; and
    a second selection circuit including
        n third switching elements each configured to switch a connection state between the write driver and a corresponding one of the n bit lines; and
        n fourth switching elements each configured to switch a connection state between the write driver and a corresponding one of the n source lines.

2. The nonvolatile semiconductor memory device of claim 1, wherein
    in a rewrite operation of changing a data value stored in any one of the m×n memory cells from a first value to a second value,
    one of the n first switching elements which corresponds to the bit line connected to the target memory cell is in an on state,
    one of the n second switching elements which corresponds to the source line connected to the target memory cell is in an off state,
    one of the n third switching elements which corresponds to the bit line connected to the target memory cell is in the off state, and
    one of the n fourth switching elements which corresponds to the source line connected to the target memory cell is in the on state.

3. The nonvolatile semiconductor memory device of claim 2, wherein
    (n−1) of the n first switching elements which do not correspond to the bit line connected to the target memory cell are in the on state,
    (n−1) of the n second switching elements which do not correspond to the source line connected to the target memory cell are in the on state,
    (n−1) of the n third switching elements which do not correspond to the bit line connected to the target memory cell are in the off state, and
    (n−1) of the n fourth switching elements which do not correspond to the source line connected to the target memory cell are in the off state.

4. The nonvolatile semiconductor memory device of claim 2, wherein
    after completion of the rewrite operation,
    the n first switching elements are in the on state,
    the n second switching elements are in the on state,
    the n third switching elements are in the off state, and
    the n fourth switching elements are in the off state.

5. The nonvolatile semiconductor memory device of claim 1, wherein
    in a rewrite operation of changing a data value stored in any one of the m×n memory cells from a second value to a first value,
    one of the n first switching elements which corresponds to the bit line connected to the target memory cell is in an off state,
    one of the n second switching elements which corresponds to the source line connected to the target memory cell is in an on state,
    one of the n third switching elements which corresponds to the bit line connected to the target memory cell is in the on state, and
    one of the n fourth switching elements which corresponds to the source line connected to the target memory cell is in the off state.

6. The nonvolatile semiconductor memory device of claim 5, wherein
    (n−1) of the n first switching elements which do not correspond to the bit line connected to the target memory cell are in the on state,
    (n−1) of the n second switching elements which do not correspond to the source line connected to the target memory cell are in the on state,
    (n−1) of the n third switching elements which do not correspond to the bit line connected to the target memory cell are in the off state, and
    (n−1) of the n fourth switching elements which do not correspond to the source line connected to the target memory cell are in the off state.

7. The nonvolatile semiconductor memory device of claim 5, wherein
    after completion of the rewrite operation,
    the n first switching elements are in the on state,
    the n second switching elements are in the on state,
    the n third switching elements are in the off state, and
    the n fourth switching elements are in the off state.

8. The nonvolatile semiconductor memory device of claim 1, further comprising:
    a sense amplifier, wherein
    one end of each of the n third switching elements is connected to the write driver and the sense amplifier, and the other end of each of the n third switching elements is connected to a corresponding one of the n bit lines,
    one end of each of the n fourth switching elements is connected to the write driver and the sense amplifier, and the other end of each of the n fourth switching elements is connected to a corresponding one of the n source lines,
    the write driver supplies the rewrite voltage in a rewrite operation of rewriting a data value stored in any one of the m×n memory cells, and
    the sense amplifier supplies a read voltage in a read operation of reading a data value stored in any one of the m×n memory cells.

9. The nonvolatile semiconductor memory device of claim 8, wherein
    in the read operation of reading a data value stored in any one of the m×n memory cells, one of the n first switching elements which corresponds to the bit line connected to the target memory cell is in an off state,
one of the n second switching elements which corresponds to the source line connected to the target memory cell is in an on state,
one of the n third switching elements which corresponds to the bit line connected to the target memory cell is in the on state, and
one of the n fourth switching elements which corresponds to the source line connected to the target memory cell is in the off state.

10. The nonvolatile semiconductor memory device of claim 9, wherein
(n−1) of the n first switching elements which do not correspond to the bit line connected to the target memory cell is in the on state,
(n−1) of the n second switching elements which do not correspond to the source line connected to the target memory cell is in the on state,
(n−1) of the n third switching elements which do not correspond to the bit line connected to the target memory cell is in the off state, and
(n−1) of the n fourth switching elements which do not correspond to the source line connected to the target memory cell is in the off state.

11. The nonvolatile semiconductor memory device of claim 9, wherein
after completion of the rewrite operation,
the n first switching elements are in the on state,
the n second switching elements are in the on state,
the n third switching elements are in the off state, and
the n fourth switching elements are in the off state.

12. The nonvolatile semiconductor memory device of claim 1, wherein
each of the m×n memory cells includes
a selection transistor having a gate connected to the word line corresponding to the memory cell, and
a memory element connected to the selection transistor in series between the bit line and the source line corresponding to the memory cell,
the memory element is configured to change a data value stored in the memory element when a pulse voltage higher than a predetermined threshold voltage is applied to both ends of the memory element, and
a voltage difference between the rewrite voltage and the reference voltage is larger than the threshold voltage.

13. The nonvolatile semiconductor memory device of claim 1, wherein
each of the m×n memory cells includes
a selection transistor having a gate connected to the word line corresponding to the memory cell, and
a variable resistance element connected to the selection transistor in series between the bit line and the source line corresponding to the memory cell.

14. The nonvolatile semiconductor memory device of claim 1, wherein
each of the m×n memory cells includes
a selection transistor having a gate connected to the word line corresponding to the memory cell, and
a ferroelectric element connected to the selection transistor in series between the bit line and the source line corresponding to the memory cell.

15. The nonvolatile semiconductor memory device of claim 1, wherein
each of the m×n memory cells includes
a selection transistor having a gate connected to the word line corresponding to the memory cell, and
a magnetic variable resistance element connected to the selection transistor in series between the bit line and the source line corresponding to the memory cell.

16. The nonvolatile semiconductor memory device of claim 1, wherein
each of the m×n memory cells includes
a selection transistor having a gate connected to the word line corresponding to the memory cell, and
a phase-change element connected to the selection transistor in series between the bit line and the source line corresponding to the memory cell.

17. A nonvolatile semiconductor memory device comprising:
a plurality of memory blocks;
m word lines, where m is an integer greater than or equal to 2;
a word line drive circuit; and
first and second select control circuits, wherein
each of the memory blocks includes
m×n memory cells disposed in m rows and n columns, where m and n are integers greater than or equal to 2;
n bit lines and n source lines each connected to m memory cells in a corresponding one of the columns of the m×n memory cells;
a write driver configured to supply a rewrite voltage;
a first selection circuit including
n first switching elements each configured to switch a connection state between a reference node to which a reference voltage is applied and a corresponding one of the n bit lines, and
n second switching elements each configured to switch a connection state between the reference node and a corresponding one of the n source lines; and
a second selection circuit including
n third switching elements each configured to switch a connection state between the write driver and a corresponding one of the n bit lines; and
n fourth switching elements each configured to switch a connection state between the write driver and a corresponding one of the n source lines,
each of the m word lines correspond to a different one of the m rows of the m×n memory cells in the memory blocks, and is connected to n memory cells included in the row corresponding to the word line,
the word line drive circuit selectively activates the m word lines,
the first select control circuit controls the n first switching elements and the n second switching elements included in the first selection circuit of each of the memory blocks, and
the second select control circuit controls the n third switching elements and the n fourth switching elements included in the second selection circuit of each of the memory blocks.

* * * * *